(12) United States Patent
Strid et al.

(10) Patent No.: US 7,764,072 B2
(45) Date of Patent: Jul. 27, 2010

(54) DIFFERENTIAL SIGNAL PROBING SYSTEM

(75) Inventors: Eric Strid, Portland, OR (US); Richard Campbell, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/710,225

(22) Filed: Feb. 22, 2007

(65) Prior Publication Data
US 2007/0285085 A1  Dec. 13, 2007

Related U.S. Application Data

(60) Provisional application No. 60/831,477, filed on Jul. 17, 2006, provisional application No. 60/813,119, filed on Jun. 12, 2006.

(51) Int. Cl.
G01R 31/02 (2006.01)
(52) U.S. Cl. ......................... 324/754; 324/149
(58) Field of Classification Search .................. 324/149, 324/754
See application file for complete search history.

(56) References Cited
U.S. PATENT DOCUMENTS

| | | | |
|---|---|---|---|
| 491,783 A | 2/1893 | Moyer | |
| 1,337,866 A | 4/1920 | Whitacker | |
| 2,142,625 A | 1/1939 | Zoethout | |
| 2,376,101 A | 5/1945 | Tyzzer | |
| 2,389,668 A | 11/1945 | Johnson | |
| 2,545,258 A | 3/1951 | Cailloux | |
| 2,762,234 A | 9/1956 | Dodd | |
| 2,901,696 A | 8/1959 | Möllfors | |
| 2,921,276 A | 1/1960 | Fubini | |
| 2,947,939 A | 8/1960 | Harwig | |
| 3,111,699 A | 11/1963 | Comeau | |
| 3,176,091 A | 3/1965 | Hanson et al. | |
| 3,193,712 A | 7/1965 | Harris | |
| 3,218,584 A | 11/1965 | Ayer | |
| 3,230,299 A | 1/1966 | Radziekowski | |
| 3,262,593 A | 7/1966 | Hainer | |
| 3,396,598 A | 8/1968 | Grispo | |
| 3,401,126 A | 9/1968 | Miller et al. | |
| 3,429,040 A | 2/1969 | Miller | |
| 3,445,770 A | 5/1969 | Harmon | |
| 3,484,679 A | 12/1969 | Hodgson et al. | |
| 3,541,222 A | 11/1970 | Parks et al. | |

(Continued)

FOREIGN PATENT DOCUMENTS

CH          607 045        11/1978

(Continued)

OTHER PUBLICATIONS

International Search Report for PCT/US06/16238 mailed Feb. 28, 2007.

(Continued)

Primary Examiner—Ha Tran T Nguyen
Assistant Examiner—Shaun Campbell
(74) Attorney, Agent, or Firm—Chernoff, Vilhauer, McClung & Stenzel

(57) ABSTRACT

A probe measurement system comprises a probe with a linear array of probe tips enabling a single probe to be used when probing a test structure with a differential signal.

26 Claims, 12 Drawing Sheets

U.S. PATENT DOCUMENTS

| | | |
|---|---|---|
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |

| | | | | | |
|---|---|---|---|---|---|
| 4,740,764 A | 4/1988 | Gerlack | 5,012,186 A | 4/1991 | Gleason |
| 4,742,571 A | 5/1988 | Letron | 5,020,219 A | 6/1991 | Leedy |
| 4,744,041 A | 5/1988 | Strunk et al. | 5,021,186 A | 6/1991 | Ota et al. |
| 4,746,857 A | 5/1988 | Sakai et al. | 5,030,907 A | 7/1991 | Yih et al. |
| 4,749,942 A | 6/1988 | Sang et al. | 5,041,782 A | 8/1991 | Marzan |
| 4,754,239 A | 6/1988 | Sedivec | 5,045,781 A | 9/1991 | Gleason et al. |
| 4,755,746 A | 7/1988 | Mallory et al. | 5,059,898 A | 10/1991 | Barsotti et al. |
| 4,755,747 A | 7/1988 | Sato | 5,061,192 A | 10/1991 | Chapin et al. |
| 4,755,874 A | 7/1988 | Esrig et al. | 5,061,823 A | 10/1991 | Carroll |
| 4,757,255 A | 7/1988 | Margozzi | 5,066,357 A | 11/1991 | Smyth, Jr. et al. |
| 4,764,723 A | 8/1988 | Strid | 5,069,628 A | 12/1991 | Crumly |
| 4,766,384 A | 8/1988 | Kleinberg et al. | 5,082,627 A | 1/1992 | Stanbro |
| 4,772,846 A | 9/1988 | Reeds | 5,084,671 A | 1/1992 | Miyata et al. |
| 4,780,670 A | 10/1988 | Cherry | 5,089,774 A | 2/1992 | Nakano |
| 4,783,625 A | 11/1988 | Harry et al. | 5,091,692 A | 2/1992 | Ohno et al. |
| 4,788,851 A | 12/1988 | Brault | 5,091,732 A | 2/1992 | Mileski et al. |
| 4,791,363 A | 12/1988 | Logan | 5,095,891 A | 3/1992 | Reitter |
| 4,793,814 A | 12/1988 | Zifcak et al. | 5,097,101 A | 3/1992 | Trobough |
| 4,795,962 A | 1/1989 | Yanagawa et al. | 5,097,207 A | 3/1992 | Blanz |
| 4,805,627 A | 2/1989 | Klingenbeck et al. | 5,101,453 A | 3/1992 | Rumbaugh |
| 4,810,981 A | 3/1989 | Herstein | 5,107,076 A | 4/1992 | Bullock et al. |
| 4,812,754 A | 3/1989 | Tracy et al. | 5,116,180 A | 5/1992 | Fung et al. |
| 4,818,059 A | 4/1989 | Kakii et al. | 5,126,286 A | 6/1992 | Chance |
| 4,827,211 A | 5/1989 | Strid et al. | 5,126,696 A | 6/1992 | Grote et al. |
| 4,831,494 A | 5/1989 | Arnold et al. | 5,128,612 A | 7/1992 | Aton et al. |
| 4,835,495 A | 5/1989 | Simonutti | 5,129,006 A | 7/1992 | Hill |
| 4,837,507 A | 6/1989 | Hechtman | 5,133,119 A | 7/1992 | Afshari et al. |
| 4,839,587 A | 6/1989 | Flatley et al. | 5,134,365 A | 7/1992 | Okubo et al. |
| 4,849,689 A | 7/1989 | Gleason et al. | 5,136,237 A | 8/1992 | Smith et al. |
| 4,851,767 A | 7/1989 | Halbout et al. | 5,138,289 A | 8/1992 | McGrath |
| 4,853,624 A | 8/1989 | Rabjohn | 5,142,224 A | 8/1992 | Smith et al. |
| 4,853,627 A | 8/1989 | Gleason et al. | 5,145,552 A | 9/1992 | Yoshizawa et al. |
| 4,858,160 A | 8/1989 | Strid et al. | 5,148,131 A | 9/1992 | Amboss et al. |
| 4,859,989 A | 8/1989 | McPherson | 5,159,264 A | 10/1992 | Anderson |
| 4,864,227 A | 9/1989 | Sato | 5,159,267 A | 10/1992 | Anderson |
| 4,871,883 A | 10/1989 | Guiol | 5,159,752 A | 11/1992 | Mahant-Shetti et al. |
| 4,871,964 A | 10/1989 | Boll et al. | 5,160,883 A | 11/1992 | Blanz |
| 4,888,550 A | 12/1989 | Reid | 5,164,319 A | 11/1992 | Hafeman et al. |
| 4,891,584 A | 1/1990 | Kamieniecki et al. | 5,166,606 A | 11/1992 | Blanz |
| 4,893,914 A | 1/1990 | Hancock et al. | 5,170,930 A | 12/1992 | Dolbear et al. |
| 4,894,612 A | 1/1990 | Drake et al. | 5,172,049 A | 12/1992 | Kiyokawa et al. |
| 4,899,126 A | 2/1990 | Yamada | 5,172,050 A | 12/1992 | Swapp |
| 4,899,998 A | 2/1990 | Feramachi | 5,172,051 A | 12/1992 | Zamborelli |
| 4,901,012 A | 2/1990 | Gloanec et al. | 5,177,438 A | 1/1993 | Littlebury et al. |
| 4,904,933 A | 2/1990 | Snyder et al. | 5,180,977 A | 1/1993 | Huff |
| 4,904,935 A | 2/1990 | Calma et al. | 5,187,443 A | 2/1993 | Bereskin |
| 4,906,920 A | 3/1990 | Huff et al. | 5,198,752 A | 3/1993 | Miyata et al. |
| 4,908,570 A | 3/1990 | Gupta et al. | 5,198,753 A | 3/1993 | Hamburgen |
| 4,912,399 A | 3/1990 | Greub et al. | 5,202,558 A | 4/1993 | Barker |
| 4,916,002 A | 4/1990 | Carver | 5,202,648 A | 4/1993 | McCandless |
| 4,916,398 A | 4/1990 | Rath | 5,207,585 A | 5/1993 | Byrnes et al. |
| 4,918,373 A | 4/1990 | Newberg | 5,214,243 A | 5/1993 | Johnson |
| 4,918,383 A | 4/1990 | Huff et al. | 5,214,374 A | 5/1993 | St. Onge |
| 4,922,128 A | 5/1990 | Dhong et al. | 5,225,037 A | 7/1993 | Elder et al. |
| 4,922,186 A | 5/1990 | Tsuchiya et al. | 5,227,730 A | 7/1993 | King et al. |
| 4,922,912 A | 5/1990 | Watanabe | 5,232,789 A | 8/1993 | Platz et al. |
| 4,926,172 A | 5/1990 | Gorsek | 5,233,197 A | 8/1993 | Bowman et al. |
| 4,929,893 A | 5/1990 | Sato et al. | 5,233,306 A | 8/1993 | Misra |
| 4,965,514 A | 10/1990 | Herrick | 5,245,292 A | 9/1993 | Milesky et al. |
| 4,970,386 A | 11/1990 | Buck | 5,266,889 A | 11/1993 | Harwood et al. |
| 4,972,073 A | 11/1990 | Lessing | 5,266,963 A | 11/1993 | Carter |
| 4,975,638 A | 12/1990 | Evans et al. | 5,267,088 A | 11/1993 | Nomura |
| 4,980,637 A | 12/1990 | Huff et al. | 5,270,664 A | 12/1993 | McMurtry et al. |
| 4,980,638 A | 12/1990 | Dermon et al. | 5,274,336 A | 12/1993 | Crook et al. |
| 4,983,910 A | 1/1991 | Majidi-Ahy et al. | 5,280,156 A | 1/1994 | Niori et al. |
| 4,987,100 A | 1/1991 | McBride et al. | 5,281,364 A | 1/1994 | Stirling et al. |
| 4,988,062 A | 1/1991 | London | 5,289,117 A | 2/1994 | Van Loan et al. |
| 4,991,290 A | 2/1991 | MacKay | 5,293,175 A | 3/1994 | Hemmie et al. |
| 4,998,062 A | 3/1991 | Ikeda | 5,298,972 A | 3/1994 | Heffner |
| 4,998,063 A | 3/1991 | Miller | 5,304,924 A | 4/1994 | Yamano et al. |
| 5,001,423 A | 3/1991 | Abrami et al. | 5,308,250 A | 5/1994 | Walz |
| 5,003,253 A | 3/1991 | Majidi-Ahy et al. | 5,313,157 A | 5/1994 | Pasiecznik, Jr. |
| 5,007,163 A | 4/1991 | Pope et al. | 5,315,237 A | 5/1994 | Iwakura et al. |

| | | | | | | |
|---|---|---|---|---|---|---|
| 5,316,435 A | 5/1994 | Mozingo | | 5,565,881 A | 10/1996 | Phillips et al. |
| 5,317,656 A | 5/1994 | Moslehi et al. | | 5,569,591 A | 10/1996 | Kell et al. |
| 5,321,352 A | 6/1994 | Takebuchi | | 5,571,324 A | 11/1996 | Sago et al. |
| 5,321,453 A | 6/1994 | Mori et al. | | 5,578,932 A | 11/1996 | Adamian |
| 5,326,412 A | 7/1994 | Schreiber et al. | | 5,583,445 A | 12/1996 | Mullen |
| 5,334,931 A | 8/1994 | Clarke et al. | | 5,584,120 A | 12/1996 | Roberts |
| 5,335,079 A | 8/1994 | Yuen et al. | | 5,584,608 A | 12/1996 | Gillespie |
| 5,347,204 A | 9/1994 | Gregory et al. | | 5,589,781 A | 12/1996 | Higgins et al. |
| 5,357,211 A | 10/1994 | Bryson et al. | | 5,594,358 A | 1/1997 | Ishikawa et al. |
| 5,360,312 A | 11/1994 | Mozingo | | 5,600,256 A | 2/1997 | Woith et al. |
| 5,361,049 A | 11/1994 | Rubin et al. | | 5,601,740 A | 2/1997 | Eldridge et al. |
| 5,363,050 A | 11/1994 | Guo et al. | | 5,610,529 A | 3/1997 | Schwindt |
| 5,367,165 A | 11/1994 | Toda et al. | | 5,611,008 A | 3/1997 | Yap |
| 5,369,368 A | 11/1994 | Kassen et al. | | 5,617,035 A | 4/1997 | Swapp |
| 5,371,654 A | 12/1994 | Beaman et al. | | 5,621,333 A | 4/1997 | Long et al. |
| 5,373,231 A | 12/1994 | Boll et al. | | 5,621,400 A | 4/1997 | Corbi |
| 5,374,938 A | 12/1994 | Hatazawa et al. | | 5,623,213 A | 4/1997 | Liu et al. |
| 5,376,790 A | 12/1994 | Linker et al. | | 5,623,214 A | 4/1997 | Pasiecznik, Jr. |
| 5,383,787 A | 1/1995 | Switky et al. | | 5,627,473 A | 5/1997 | Takami |
| 5,389,885 A | 2/1995 | Swart | | 5,628,057 A | 5/1997 | Phillips et al. |
| 5,395,253 A | 3/1995 | Crumly | | 5,629,838 A | 5/1997 | Knight et al. |
| 5,397,855 A | 3/1995 | Ferlier | | 5,631,571 A | 5/1997 | Spaziani et al. |
| 5,404,111 A | 4/1995 | Mori et al. | | 5,633,780 A | 5/1997 | Cronin |
| 5,408,188 A | 4/1995 | Katoh | | 5,635,846 A | 6/1997 | Beaman et al. |
| 5,408,189 A | 4/1995 | Swart et al. | | 5,642,298 A | 6/1997 | Mallory et al. |
| 5,412,330 A | 5/1995 | Ravel et al. | | 5,644,248 A | 7/1997 | Fujimoto |
| 5,412,866 A | 5/1995 | Woith et al. | | 5,653,939 A | 8/1997 | Hollis et al. |
| 5,414,565 A | 5/1995 | Sullivan et al. | | 5,656,942 A | 8/1997 | Watts et al. |
| 5,422,574 A | 6/1995 | Kister | | 5,659,421 A | 8/1997 | Rahmel et al. |
| 5,430,813 A | 7/1995 | Anderson et al. | | 5,666,063 A | 9/1997 | Abercrombie et al. |
| 5,441,690 A | 8/1995 | Ayala-Esquilin et al. | | 5,669,316 A | 9/1997 | Faz et al. |
| 5,451,884 A | 9/1995 | Sauerland | | 5,670,322 A | 9/1997 | Eggers et al. |
| 5,453,404 A | 9/1995 | Leedy | | 5,670,888 A | 9/1997 | Cheng |
| 5,457,398 A | 10/1995 | Schwindt et al. | | 5,672,816 A | 9/1997 | Park et al. |
| 5,463,324 A | 10/1995 | Wardwell et al. | | 5,675,499 A | 10/1997 | Lee et al. |
| 5,467,024 A | 11/1995 | Swapp | | 5,675,932 A | 10/1997 | Mauney |
| 5,469,324 A | 11/1995 | Henderson et al. | | 5,676,360 A | 10/1997 | Boucher et al. |
| 5,471,185 A | 11/1995 | Shea et al. | | 5,678,210 A | 10/1997 | Hannah |
| 5,475,316 A | 12/1995 | Hurley et al. | | 5,685,232 A | 11/1997 | Inoue |
| 5,476,211 A | 12/1995 | Khandros | | 5,686,317 A | 11/1997 | Akram et al. |
| 5,477,011 A | 12/1995 | Singles et al. | | 5,686,960 A | 11/1997 | Sussman et al. |
| 5,478,748 A | 12/1995 | Akins, Jr. et al. | | 5,688,618 A | 11/1997 | Hulderman et al. |
| 5,479,108 A | 12/1995 | Cheng | | 5,700,844 A | 12/1997 | Hedrick et al. |
| 5,479,109 A | 12/1995 | Lau et al. | | 5,704,355 A | 1/1998 | Bridges |
| 5,481,196 A | 1/1996 | Nosov | | 5,715,819 A | 2/1998 | Svenson et al. |
| 5,481,936 A | 1/1996 | Yanagisawa | | 5,720,098 A | 2/1998 | Kister |
| 5,487,999 A | 1/1996 | Farnworth | | 5,723,347 A | 3/1998 | Kirano et al. |
| 5,488,954 A | 2/1996 | Sleva et al. | | 5,726,211 A | 3/1998 | Hedrick et al. |
| 5,491,425 A | 2/1996 | Watanabe et al. | | 5,728,091 A | 3/1998 | Payne et al. |
| 5,493,070 A | 2/1996 | Habu | | 5,729,150 A | 3/1998 | Schwindt |
| 5,493,236 A | 2/1996 | Ishii et al. | | 5,731,920 A | 3/1998 | Katsuragawa |
| 5,500,606 A | 3/1996 | Holmes | | 5,742,174 A | 4/1998 | Kister et al. |
| 5,505,150 A | 4/1996 | James et al. | | 5,744,971 A | 4/1998 | Chan et al. |
| 5,506,498 A | 4/1996 | Anderson et al. | | 5,748,506 A | 5/1998 | Bockelman |
| 5,506,515 A | 4/1996 | Godshalk et al. | | 5,751,153 A * | 5/1998 | Bockelman ................. 324/638 |
| 5,507,652 A | 4/1996 | Wardwell | | 5,751,252 A | 5/1998 | Phillips |
| 5,510,792 A | 4/1996 | Ono et al. | | 5,756,021 A | 5/1998 | Bedrick et al. |
| 5,511,010 A | 4/1996 | Burns | | 5,756,908 A | 5/1998 | Knollmeyer et al. |
| 5,512,835 A | 4/1996 | Rivera et al. | | 5,764,070 A | 6/1998 | Pedder |
| 5,517,126 A | 5/1996 | Yamaguchi | | 5,767,690 A | 6/1998 | Fujimoto |
| 5,521,518 A | 5/1996 | Higgins | | 5,772,451 A | 6/1998 | Dozier, II et al. |
| 5,521,522 A | 5/1996 | Abe et al. | | 5,773,780 A | 6/1998 | Eldridge et al. |
| 5,523,694 A | 6/1996 | Cole, Jr. | | 5,777,485 A | 7/1998 | Tanaka et al. |
| 5,528,158 A | 6/1996 | Sinsheimer et al. | | 5,785,538 A | 7/1998 | Beaman et al. |
| 5,530,372 A | 6/1996 | Lee et al. | | 5,792,668 A | 8/1998 | Fuller et al. |
| 5,531,022 A | 7/1996 | Beaman et al. | | 5,793,213 A | 8/1998 | Bockelman et al. |
| 5,532,608 A | 7/1996 | Behfar-Rad et al. | | 5,794,133 A | 8/1998 | Kashima |
| 5,537,372 A | 7/1996 | Albrecht et al. | | 5,803,607 A | 9/1998 | Jones et al. |
| 5,539,323 A | 7/1996 | Davis, Jr. | | 5,804,607 A | 9/1998 | Hedrick et al. |
| 5,539,676 A | 7/1996 | Yamaguchi | | 5,804,982 A | 9/1998 | Lo et al. |
| 5,550,481 A | 8/1996 | Holmes et al. | | 5,804,983 A | 9/1998 | Nakajima et al. |
| 5,561,378 A * | 10/1996 | Bockelman et al. ......... 324/754 | | 5,806,181 A | 9/1998 | Khandros et al. |
| 5,565,788 A | 10/1996 | Burr et al. | | 5,807,107 A | 9/1998 | Bright et al. |

| Patent | Date | Inventor |
|---|---|---|
| 5,808,874 A | 9/1998 | Smith |
| 5,810,607 A | 9/1998 | Shih et al. |
| 5,811,751 A | 9/1998 | Leona et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,824,494 A | 10/1998 | Feldberg |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,833,601 A | 11/1998 | Swartz et al. |
| 5,838,160 A | 11/1998 | Beaman et al. |
| 5,841,288 A | 11/1998 | Meaney et al. |
| 5,841,342 A | 11/1998 | Hegmann et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,852,871 A | 12/1998 | Khandros |
| 5,854,608 A | 12/1998 | Leisten |
| 5,864,946 A | 2/1999 | Eldridge et al. |
| 5,867,073 A | 2/1999 | Weinreb et al. |
| 5,869,326 A | 2/1999 | Hofmann |
| 5,869,974 A | 2/1999 | Akram et al. |
| 5,874,361 A | 2/1999 | Collins et al. |
| 5,876,082 A | 3/1999 | Kempf et al. |
| 5,878,486 A | 3/1999 | Eldridge et al. |
| 5,879,289 A | 3/1999 | Yarush et al. |
| 5,883,522 A | 3/1999 | O'Boyle |
| 5,883,523 A | 3/1999 | Ferland et al. |
| 5,884,398 A | 3/1999 | Eldridge et al. |
| 5,888,075 A | 3/1999 | Hasegawa et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,940,965 A | 8/1999 | Uhling et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,977,783 A | 11/1999 | Takayama et al. |
| 5,981,268 A | 11/1999 | Kovacs et al. |
| 5,982,166 A | 11/1999 | Mautz |
| 5,983,493 A | 11/1999 | Eldridge et al. |
| 5,993,611 A | 11/1999 | Moroney, III et al. |
| 5,994,152 A | 11/1999 | Khandros et al. |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,006,002 A | 12/1999 | Motok et al. |
| 6,013,586 A | 1/2000 | McGhee et al. |
| 6,019,612 A | 2/2000 | Hasegawa et al. |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge et al. |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,091,256 A | 7/2000 | Long et al. |
| 6,096,567 A | 8/2000 | Kaplan et al. |
| 6,100,708 A | 8/2000 | Mizuta |
| 6,100,815 A | 8/2000 | Pailthorp |
| 6,104,201 A | 8/2000 | Beaman et al. |
| 6,104,206 A | 8/2000 | Verkull |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,836 A | 9/2000 | Vallencourt |
| 6,124,725 A | 9/2000 | Sato |
| 6,127,831 A | 10/2000 | Khoury et al. |
| 6,130,536 A | 10/2000 | Powell et al. |
| 6,137,302 A | 10/2000 | Schwindt |
| 6,144,212 A | 11/2000 | Mizuta |
| 6,146,908 A | 11/2000 | Falque et al. |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |

| Patent | Kind | Date | Inventor |
|---|---|---|---|
| 6,184,587 | B1 | 2/2001 | Khandros et al. |
| 6,184,845 | B1 | 2/2001 | Leisten et al. |
| 6,191,596 | B1 | 2/2001 | Abiko |
| 6,194,720 | B1 | 2/2001 | Li et al. |
| 6,201,453 | B1 | 3/2001 | Chan et al. |
| 6,206,273 | B1 | 3/2001 | Beaman et al. |
| 6,208,225 | B1 | 3/2001 | Miller |
| RE37,130 | E | 4/2001 | Fiori, Jr. |
| 6,211,663 | B1 | 4/2001 | Moulthrop et al. |
| 6,211,837 | B1 | 4/2001 | Crouch et al. |
| 6,215,196 | B1 | 4/2001 | Eldridge et al. |
| 6,215,295 | B1 | 4/2001 | Smith, III |
| 6,215,670 | B1 | 4/2001 | Khandros |
| 6,218,910 | B1 | 4/2001 | Miller |
| 6,222,031 | B1 | 4/2001 | Wakabayashi et al. |
| 6,222,970 | B1 | 4/2001 | Wach et al. |
| 6,229,327 | B1 | 5/2001 | Boll et al. |
| 6,232,149 | B1 | 5/2001 | Dozier, II et al. |
| 6,232,787 | B1 | 5/2001 | Lo et al. |
| 6,232,788 | B1 | 5/2001 | Schwindt et al. |
| 6,232,789 | B1 | 5/2001 | Schwindt |
| 6,233,613 | B1 | 5/2001 | Walker et al. |
| 6,236,223 | B1 | 5/2001 | Brady et al. |
| 6,242,803 | B1 | 6/2001 | Khandros et al. |
| 6,242,929 | B1 | 6/2001 | Mizuta |
| 6,245,692 | B1 | 6/2001 | Pearce et al. |
| 6,246,247 | B1 | 6/2001 | Eldridge et al. |
| 6,251,595 | B1 | 6/2001 | Gordon et al. |
| 6,255,126 | B1 | 7/2001 | Mathieu et al. |
| 6,256,882 | B1 | 7/2001 | Gleason et al. |
| 6,257,564 | B1 | 7/2001 | Avneri et al. |
| 6,259,260 | B1 | 7/2001 | Smith et al. |
| 6,265,950 | B1 | 7/2001 | Schmidt et al. |
| 6,268,015 | B1 | 7/2001 | Mathieu et al. |
| 6,268,016 | B1 | 7/2001 | Bhatt et al. |
| 6,271,673 | B1 | 8/2001 | Furuta et al. |
| 6,274,823 | B1 | 8/2001 | Khandros et al. |
| 6,275,043 | B1 | 8/2001 | Muhlberger et al. |
| 6,275,738 | B1 | 8/2001 | Kasevich et al. |
| 6,278,051 | B1 | 8/2001 | Peabody |
| 6,278,411 | B1 | 8/2001 | Ohlsson et al. |
| 6,281,691 | B1 | 8/2001 | Matsunaga et al. |
| 6,286,208 | B1 | 9/2001 | Shih et al. |
| 6,292,760 | B1 | 9/2001 | Burns |
| 6,295,729 | B1 | 10/2001 | Beaman et al. |
| 6,300,775 | B1 | 10/2001 | Peach et al. |
| 6,300,780 | B1 | 10/2001 | Beaman et al. |
| 6,307,161 | B1 | 10/2001 | Grube et al. |
| 6,307,363 | B1 | 10/2001 | Anderson |
| 6,307,672 | B1 | 10/2001 | DeNure |
| 6,310,483 | B1 | 10/2001 | Taura et al. |
| 6,320,372 | B1 | 11/2001 | Keller |
| 6,320,396 | B1 | 11/2001 | Nikawa |
| 6,327,034 | B1 | 12/2001 | Hoover et al. |
| 6,329,827 | B1 | 12/2001 | Beaman et al. |
| 6,330,164 | B1 | 12/2001 | Khandros et al. |
| 6,332,270 | B2 | 12/2001 | Beaman et al. |
| 6,334,247 | B1 | 1/2002 | Beaman et al. |
| 6,335,625 | B1 | 1/2002 | Bryant et al. |
| 6,339,338 | B1 | 1/2002 | Eldridge et al. |
| 6,340,568 | B2 | 1/2002 | Hefti |
| 6,340,895 | B1 | 1/2002 | Uher et al. |
| 6,351,885 | B2 | 3/2002 | Suzuki et al. |
| 6,352,454 | B1 | 3/2002 | Kim et al. |
| 6,359,456 | B1 | 3/2002 | Hembree et al. |
| 6,362,792 | B1 | 3/2002 | Sawamura et al. |
| 6,366,247 | B1 | 4/2002 | Sawamura et al. |
| 6,369,776 | B1 | 4/2002 | Leisten et al. |
| 6,376,258 | B2 | 4/2002 | Hefti |
| 6,384,614 | B1 | 5/2002 | Hager et al. |
| 6,384,615 | B2 | 5/2002 | Schwindt |
| 6,388,455 | B1 | 5/2002 | Kamieniecki et al. |
| 6,395,480 | B1 | 5/2002 | Hefti |
| 6,396,296 | B1 | 5/2002 | Tarter et al. |
| 6,396,298 | B1 | 5/2002 | Young et al. |
| 6,400,168 | B2 | 6/2002 | Matsunaga et al. |
| 6,404,213 | B2 | 6/2002 | Noda |
| 6,407,542 | B1 | 6/2002 | Conte |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,420,722 | B2 | 7/2002 | Moore et al. |
| 6,424,316 | B1 | 7/2002 | Leisten et al. |
| 6,429,029 | B1 | 8/2002 | Eldridge et al. |
| 6,441,315 | B1 | 8/2002 | Eldridge et al. |
| 6,442,831 | B1 | 9/2002 | Khandros et al. |
| 6,447,339 | B1 | 9/2002 | Reed et al. |
| 6,448,788 | B1 | 9/2002 | Meaney et al. |
| 6,448,865 | B1 | 9/2002 | Miller |
| 6,452,406 | B1 | 9/2002 | Beaman et al. |
| 6,452,411 | B1 | 9/2002 | Miller et al. |
| 6,456,099 | B1 | 9/2002 | Eldridge et al. |
| 6,456,103 | B1 | 9/2002 | Eldridge et al. |
| 6,459,343 | B1 | 10/2002 | Miller |
| 6,459,739 | B1 | 10/2002 | Vitenberg |
| 6,468,098 | B1 | 10/2002 | Eldridge |
| 6,475,822 | B2 | 11/2002 | Eldridge |
| 6,476,333 | B1 | 11/2002 | Khandros et al. |
| 6,476,442 | B1 | 11/2002 | Williams et al. |
| 6,476,630 | B1 | 11/2002 | Whitten et al. |
| 6,479,308 | B1 | 11/2002 | Eldridge |
| 6,480,013 | B1 | 11/2002 | Nayler et al. |
| 6,480,978 | B1 | 11/2002 | Roy et al. |
| 6,481,939 | B1 | 11/2002 | Gillespie et al. |
| 6,482,013 | B2 | 11/2002 | Eldridge et al. |
| 6,483,327 | B1 | 11/2002 | Bruce et al. |
| 6,488,405 | B1 | 12/2002 | Eppes et al. |
| 6,490,471 | B1 | 12/2002 | Svenson et al. |
| 6,491,968 | B1 | 12/2002 | Mathieu et al. |
| 6,496,024 | B2 | 12/2002 | Schwindt |
| 6,499,121 | B1 | 12/2002 | Roy et al. |
| 6,501,343 | B2 | 12/2002 | Miller |
| 6,509,751 | B1 | 1/2003 | Mathieu et al. |
| 6,512,482 | B1 | 1/2003 | Nelson et al. |
| 6,520,778 | B1 | 2/2003 | Eldridge et al. |
| 6,525,555 | B1 | 2/2003 | Khandros et al. |
| 6,526,655 | B2 | 3/2003 | Beaman et al. |
| 6,528,984 | B2 | 3/2003 | Beaman et al. |
| 6,528,993 | B1 | 3/2003 | Shin et al. |
| 6,529,844 | B1 | 3/2003 | Kapetanic et al. |
| 6,534,856 | B1 | 3/2003 | Dozier, II et al. |
| 6,538,214 | B2 | 3/2003 | Khandros |
| 6,538,538 | B2 | 3/2003 | Hreish et al. |
| 6,539,531 | B2 | 3/2003 | Miller et al. |
| 6,548,311 | B1 | 4/2003 | Knoll |
| 6,549,022 | B1 | 4/2003 | Cole, Jr. et al. |
| 6,549,106 | B2 | 4/2003 | Martin |
| 6,551,884 | B2 | 4/2003 | Masuoka |
| 6,559,671 | B2 | 5/2003 | Miller et al. |
| 6,566,079 | B2 | 5/2003 | Hefti |
| 6,572,608 | B1 | 6/2003 | Lee et al. |
| 6,573,702 | B2 | 6/2003 | Marcuse et al. |
| 6,578,264 | B1 | 6/2003 | Gleason et al. |
| 6,580,283 | B1 | 6/2003 | Carbone et al. |
| 6,582,979 | B2 | 6/2003 | Coccioli et al. |
| 6,587,327 | B1 | 7/2003 | Devoe et al. |
| 6,597,187 | B2 | 7/2003 | Eldridge et al. |
| 6,603,322 | B1 | 8/2003 | Boll et al. |
| 6,603,323 | B1 | 8/2003 | Miller et al. |
| 6,603,324 | B2 | 8/2003 | Eldridge et al. |
| 6,605,941 | B2 | 8/2003 | Abe |
| 6,605,951 | B1 | 8/2003 | Cowan |
| 6,605,955 | B1 | 8/2003 | Costello et al. |
| 6,606,014 | B2 | 8/2003 | Miller |

| | | | |
|---|---|---|---|
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge et al. |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,833,724 B2 | 12/2004 | Binkley et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,859,054 B1 | 2/2005 | Zhou et al. |
| 6,862,727 B2 | 3/2005 | Stevens |
| 6,864,105 B2 | 3/2005 | Grube et al. |
| 6,864,694 B2 | 3/2005 | McTigue |
| 6,870,359 B1 | 3/2005 | Sekel |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |

| | | |
|---|---|---|
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,328 B1 | 4/2006 | Beerling |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,071,722 B2 | 7/2006 | Yamada et al. |
| 7,088,981 B2 | 8/2006 | Chang |
| 7,091,729 B2 | 8/2006 | Kister |
| 7,096,133 B1 | 8/2006 | Martin et al. |
| 7,102,366 B2 | 9/2006 | Denen et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,253,646 B2 | 8/2007 | Lou et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sugiyama, et al. |
| 7,332,923 B2 | 2/2008 | Schott, et al. |
| 7,342,402 B2 | 3/2008 | Kim et al. |
| 7,403,028 B2 | 7/2008 | Campbell |
| 7,427,868 B2 | 9/2008 | Strid et al. |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0030480 A1 | 3/2002 | Appen et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0105396 A1 | 8/2002 | Streeter et al. |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |

| | | | | | | |
|---|---|---|---|---|---|---|
| 2002/0168659 A1 | 11/2002 | Hefti et al. | | 2005/0184742 A1 | 8/2005 | Huang et al. |
| 2002/0176160 A1 | 11/2002 | Suzuki et al. | | 2005/0195124 A1 | 9/2005 | Baliarda et al. |
| 2002/0180466 A1 | 12/2002 | Hiramatsu et al. | | 2005/0229053 A1 | 10/2005 | Sunter |
| 2002/0197709 A1 | 12/2002 | Van der Weide et al. | | 2005/0236587 A1 | 10/2005 | Kodama et al. |
| 2003/0010877 A1 | 1/2003 | Landreville et al. | | 2005/0237102 A1 | 10/2005 | Tanaka |
| 2003/0030822 A1 | 2/2003 | Finarov | | 2006/0030060 A1 | 2/2006 | Noguchi et al. |
| 2003/0032000 A1 | 2/2003 | Liu et al. | | 2006/0052075 A1 | 3/2006 | Galivanche et al. |
| 2003/0040004 A1 | 2/2003 | Hefti et al. | | 2006/0155270 A1 | 7/2006 | Hancock et al. |
| 2003/0057513 A1 | 3/2003 | Leedy | | 2006/0184041 A1 | 8/2006 | Andrews et al. |
| 2003/0062915 A1 | 4/2003 | Arnold et al. | | 2006/0220663 A1 | 10/2006 | Oikawa |
| 2003/0072549 A1 | 4/2003 | Facer et al. | | 2006/0226864 A1 | 10/2006 | Kramer |
| 2003/0076585 A1 | 4/2003 | Ledley | | 2007/0024506 A1 | 2/2007 | Hardacker |
| 2003/0077649 A1 | 4/2003 | Cho et al. | | 2007/0030021 A1 | 2/2007 | Cowan et al. |
| 2003/0088180 A1 | 5/2003 | Van Veen et al. | | 2007/0145989 A1 | 6/2007 | Zhu et al. |
| 2003/0119057 A1 | 6/2003 | Gascoyne et al. | | 2008/0111571 A1 | 5/2008 | Smith et al. |
| 2003/0139662 A1 | 7/2003 | Seidman | | | | |
| 2003/0139790 A1 | 7/2003 | Ingle et al. | | FOREIGN PATENT DOCUMENTS | | |
| 2003/0155939 A1 | 8/2003 | Lutz et al. | | CN | 1083975 | 3/1994 |
| 2003/0170898 A1 | 9/2003 | Gundersen et al. | | DE | 2951072 | 7/1981 |
| 2003/0184332 A1 | 10/2003 | Tomimatsu et al. | | DE | 3426565 | 1/1986 |
| 2003/0215966 A1 | 11/2003 | Rolda, Jr. et al. | | DE | 3637549 | 5/1988 |
| 2003/0234659 A1 | 12/2003 | Zieleman | | DE | 288234 | 3/1991 |
| 2004/0015060 A1 | 1/2004 | Samsoondar et al. | | DE | 4223658 | 1/1993 |
| 2004/0021475 A1 | 2/2004 | Ito et al. | | DE | 9313420 | 10/1993 |
| 2004/0029425 A1 | 2/2004 | Yean et al. | | DE | 19522774 | 1/1997 |
| 2004/0061514 A1 | 4/2004 | Schwindt et al. | | DE | 19542955 | 5/1997 |
| 2004/0066181 A1 | 4/2004 | Thies | | DE | 19618717 | 1/1998 |
| 2004/0069776 A1 | 4/2004 | Fagrell et al. | | DE | 19749687 | 5/1998 |
| 2004/0090223 A1 | 5/2004 | Yonezawa | | DE | 29809568 | 10/1998 |
| 2004/0095145 A1 | 5/2004 | Boudiaf et al. | | DE | 10003282 | 10/2000 |
| 2004/0095641 A1 | 5/2004 | Russum et al. | | DE | 10000324 | 7/2001 |
| 2004/0100276 A1 | 5/2004 | Fanton | | DE | 20220754 | 5/2004 |
| 2004/0100297 A1 | 5/2004 | Tanioka et al. | | EP | 0230766 | 12/1985 |
| 2004/0108847 A1 | 6/2004 | Stoll et al. | | EP | 0195520 | 9/1986 |
| 2004/0113640 A1 | 6/2004 | Cooper et al. | | EP | 0230348 | 7/1987 |
| 2004/0130787 A1 | 7/2004 | Thome-Forster et al. | | EP | 0259163 | 3/1988 |
| 2004/0132222 A1 | 7/2004 | Hembree et al. | | EP | 0259183 | 3/1988 |
| 2004/0134899 A1 | 7/2004 | Hiramatsu et al. | | EP | 0259942 | 3/1988 |
| 2004/0140819 A1 | 7/2004 | McTigue et al. | | EP | 0261986 | 3/1988 |
| 2004/0147034 A1 | 7/2004 | Gore et al. | | EP | 0270422 | 6/1988 |
| 2004/0162689 A1 | 8/2004 | Jamneala et al. | | EP | 0333521 | 9/1989 |
| 2004/0170312 A1 | 9/2004 | Soenksen | | EP | 0460911 | 12/1991 |
| 2004/0175294 A1 | 9/2004 | Ellison et al. | | EP | 0846476 | 6/1998 |
| 2004/0186382 A1 | 9/2004 | Modell et al. | | EP | 0 945 736 | 9/1999 |
| 2004/0193382 A1 | 9/2004 | Adamian et al. | | EP | 0945736 | 9/1999 |
| 2004/0197771 A1 | 10/2004 | Powers et al. | | GB | 579665 | 8/1946 |
| 2004/0199350 A1 | 10/2004 | Blackham et al. | | GB | 2014315 | 8/1979 |
| 2004/0201388 A1 | 10/2004 | Barr | | GB | 2179458 | 3/1987 |
| 2004/0207072 A1 | 10/2004 | Hiramatsu et al. | | JP | 52-19046 | 2/1977 |
| 2004/0207424 A1 | 10/2004 | Hollman | | JP | 53-037077 | 4/1978 |
| 2004/0239338 A1 | 12/2004 | Jonsson et al. | | JP | 53037077 | 4/1978 |
| 2004/0246004 A1 | 12/2004 | Heuermann | | JP | 53-052354 | 5/1978 |
| 2004/0251922 A1 | 12/2004 | Martens et al. | | JP | 55-115383 | 9/1980 |
| 2005/0024069 A1 | 2/2005 | Hayden et al. | | JP | 55115383 | 9/1980 |
| 2005/0026276 A1 | 2/2005 | Chou | | JP | 56-007439 | 1/1981 |
| 2005/0030047 A1 | 2/2005 | Adamian | | JP | 56-88333 | 7/1981 |
| 2005/0054029 A1 | 3/2005 | Tomimatsu et al. | | JP | 5691503 | 7/1981 |
| 2005/0062533 A1 | 3/2005 | Vice | | JP | 56088333 | 7/1981 |
| 2005/0068054 A1 | 3/2005 | Mok et al. | | JP | 57-075480 | 5/1982 |
| 2005/0083130 A1 | 4/2005 | Grilo | | JP | 57075480 | 5/1982 |
| 2005/0088191 A1 | 4/2005 | Lesher | | JP | 57-163035 | 10/1982 |
| 2005/0101846 A1 | 5/2005 | Fine et al. | | JP | 57163035 | 10/1982 |
| 2005/0116730 A1 | 6/2005 | Hsu | | JP | 57171805 | 10/1982 |
| 2005/0142033 A1 | 6/2005 | Glezer et al. | | JP | 58-130602 | 8/1983 |
| 2005/0151548 A1* | 7/2005 | Hayden et al. .............. 324/754 | | JP | 594189 U | 1/1984 |
| 2005/0156675 A1 | 7/2005 | Rohde et al. | | JP | 60-5462 | 4/1984 |
| 2005/0164160 A1 | 7/2005 | Gunter et al. | | JP | 60-236241 | 11/1985 |
| 2005/0165316 A1 | 7/2005 | Lowery et al. | | JP | 61142802 | 6/1986 |
| 2005/0168722 A1 | 8/2005 | Forstner et al. | | JP | 62-11243 | 1/1987 |
| 2005/0172703 A1 | 8/2005 | Kley | | JP | 62-51235 | 3/1987 |
| 2005/0174191 A1 | 8/2005 | Brunker et al. | | JP | 62-58650 | 3/1987 |
| 2005/0178980 A1 | 8/2005 | Skidmore et al. | | JP | 62-098634 | 5/1987 |
| 2005/0179444 A1 | 8/2005 | Tiemeijer | | | | |

| | | |
|---|---|---|
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 10142260 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Cohn, S, "Properties of Ridge Wave Guide," Proceedings of the I.R.E., Aug. 1947, pp. 783-788.

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF) Software," MT950D Series, Sep. 20, 1982, 2 pages.
Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurement of High-speed Package and Interconnect Parasitics," IEEE 1988 Custom Integrated Circuits Conference, pp. 23.3.1-23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetector characteristics," Applied Optics, vol. 27 pp. 3059-3061, Aug. 1988.
Design Technique, "Adjustable Test Fixture," 1988.
Tong, Peter R., et al., "Noise Measurements at MM-Wave Frequencies," 176 Microwave Journal Jul. 31, 1988.
Barsotti, C., et al., "New Probe Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Esteban, J., et al., "Mode Spectrum of Waveguides Using a Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.
Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.
Liu, S.M. Joseph, et al., "A New Probe for W-band On-wafer Measurements," IEEE MTT-S Digest, 1993, pp. 1335-1338.
Photo of Micromanipulator Probe Station, 1994.
Maury Microwave Corp., Transistor Test Fixture (TTF) MT950 Series, May 31, 1995, Advanced Data, 4T-0011.
Cascade Microtech, "Layout rules for WPH-900 Series probes," Applications Note, 1996.
Cascade Microtech, "Air coplanar Probe Series," 1997.
Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.
"The Air Coplanar Probe offers a highly compliant, rugged probe with lowest insertion loss available," Cascade Microtech, Inc., Air coplanar Probe Series, 2000.
Cascade Microtech, "On-Wafer Test Solutions for State-of-the-Art Electro-Optical Components," 2001.
Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.
"Laser Diode Test Solution," Oct. 9, 2002, http:/www.cascademicrotech.com/index.cfm/fuseaction/pg.view/pID/136.
Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.
Basu, S., et al, "A Membrane Quandrant Probe for R&D Applications," Cascade Microtech, Inc. At Least one year prior to filing.
Electrical Operation, Calibration and Measurement Steps with the HP 8510, At least one year prior to filing.
Whinnery, J.R. et al., "Equivalent Circuits for Discontinuities in Transmission Lines," Proceedings of IRE, at least one year prior to filing.
Inter-Continental Microwave, Application Note: 101, Microwave Semiconductor Chip Measurements using the HP 8510B TRL-Calibration Technique, at least one year prior to filing.
Cascade Microtech, "Special Purpose Probe 40/80 Gb/s High Performance Quandrant," at least one year prior to filing.
Agilent Technology Product Information, HPW281D Waveguide Adapter, 1 mm (m) to W- Band, 75 GHz to 110 GHz.
Cascade Microtech, "Introducing the World's First Microwave Wafer Probing Equipment," 4 pages, 1983.
Malm, R.L. "Reduction of Stray Fields About SEM Samples," IBM Technical Disclosure Bulletin, vol. 21, No. 7, Dec. 1978 2 pages.
Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.
Mark S. Boguski and Martin W. McIntosh, "Biomedical informatics for proteomics," insight: review article, Nature 422, 233-237 (2003); doi:10.1038/nature01515.
Daniel Vanderweide, "THz Frequency Science & Technology Biomolecular Interaction Sensing with Sub-Terahertz Fields," University of Wisconsin-Madison, 2 pages, date unknown.
L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.
Sam Hanash, "insight review articles, Disease proteomics," Nature, vol. 422, Mar. 13, 2003, pp. 226-232.
Mike Tyers and Matthias Mann, "insight overview, From genomics to proteomics," Nature, vol. 422, Mar. 13, 2003, pp. 193-197.
Andrej Salt, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

The Micromanipulator Company, data sheet, Double Sided Probing System, Jul. 2002, 2 pages.

Bob Stengel, "Neutralized Differential Amplifiers using Mixed-Mode s-parameters," 2003 IEEE Radio Frequency Integrated Circuits Symposium, pp. 711-714.

* cited by examiner

DIFFERENTIAL SIGNAL PROBING SYSTEM

CROSS-REFERENCE TO RELATED APPLICATIONS

This application claims the benefit of U.S. Provisional Application No. 60/813,119, filed Jun. 12, 2006 and U.S. Provisional Application No. 60/831,477, filed Jul. 17, 2006.

BACKGROUND OF THE INVENTION

The present invention relates to probe measurement systems for testing integrated circuits and other microelectronic devices and, more particularly, probe measurement systems utilizing differential signaling for testing microelectronic devices.

Integrated circuits (ICs) are economically attractive because large numbers of often complex circuits, for example microprocessors, can be inexpensively fabricated on the surface of a wafer or substrate. Following fabrication, individual dies, including one or more circuits, are separated or singulated and encased in a package that provides for electrical connections between the exterior of the package and the circuit on the enclosed die. The separation and packaging of a die comprises a significant portion of the cost of manufacturing an integrated circuit device and to monitor and control the IC fabrication process and avoid the cost of packaging defective dies, manufacturers commonly add electrical circuits or test structures to the wafer to enable on-wafer testing or "probing" to verify characteristics of the integrated circuits before the dies are singulated.

Referring to FIG. 1, a test structure 20 typically includes a device-under-test (DUT) 22, a plurality of metallic probe or bond pads 24 that are deposited at the wafer's surface and a plurality of conductive vias 26 that connect the probe pads to the DUT which is typically fabricated beneath the surface of the wafer 28. The DUT typically comprises a simple circuit that includes a copy of one or more of the basic elements of the integrated circuit, such as a single line of conducting material, a chain of vias or a single transistor. The circuit elements of the DUT are typically produced with the same process and in the same layers of the fabrication as the corresponding elements of the integrated circuit. The marketable ICs are typically evaluated or characterized "on-wafer" by applying a test instrument generated signal to the test structure and measuring the response of the test structure to the signal. Since the circuit elements of the DUT are fabricated with the same process as the corresponding elements of the marketable integrated circuit, the electrical properties of the DUT are expected to be representative of the electrical properties of the corresponding components of the ICs.

Integrated circuits commonly utilize single ended or ground referenced signaling with a ground plane at the lower surface of the substrate on which the active and passive devices of the circuit are fabricated. As a result of the physical make up of the devices of an integrated circuit, parasitic interconnections exist between many of the parts of the individual devices and between parts of the devices and the wafer on which the devices are fabricated. These interconnections are commonly capacitive and/or inductive in nature and have frequency dependent impedances. For example, the terminals of transistors fabricated on semi-conductive substrates or wafers are typically capacitively interconnected, through the substrate, to the ground plane. The impedance of this parasitic capacitive interconnection is frequency dependent and at higher frequencies the ground potential and the true nature of ground referenced signals becomes uncertain.

Balanced devices utilizing differential signals are more tolerant to poor radio frequency (RF) grounding than single ended devices making them attractive for high performance ICs. A differential gain cell 30 is a balanced device comprising two nominally identical circuit halves 30A, 30B. When biased, with a DC current source 32, and stimulated with a differential mode signal, comprising even and odd mode components of equal amplitude and opposite phase ($S_i^{+1}$ and $S_i^{-1}$) 34, 36, a virtual ground is established at the symmetrical axis 38 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor RF grounding better than circuits operated with single ended signals.

In addition, the two waveforms of the differential output signal ($S_o^{+1}$ and $S_o^{-1}$) 40, 42 are mutual references providing faster and more certain transition from one binary value to the other for digital devices and enabling operation with a reduced voltage swing for the signal. Typically, differential devices can operate at lower signal power and higher data rates than single ended devices. Moreover, noise from external sources, such as adjacent conductors, tends to couple, electrically and electromagnetically, in the common mode and cancel in the differential mode. As a result, balanced or differential circuits have good immunity to noise, including noise at even-harmonic frequencies since signals that are of opposite phase at the fundamental frequency are in phase at the even harmonics. Improved tolerance to poor RF grounding, increased resistance to noise and reduced power consumption make differential devices attractive for ICs that operate at higher frequencies. A test structure comprising a differential gain cell enables on wafer testing and characterization of differential devices included in the marketable ICs fabricated on the wafer.

At higher frequencies, on-wafer characterization is commonly performed with a network analyzer. The network analyzer comprises a source of an AC signal, commonly, a radio frequency (RF) signal, that is used to stimulate the DUT of a test structure. A forward-reverse switch directs the stimulating signals to one or more of the probe pads of the test structure. Directional couplers or bridges pick off the forward or reverse waves traveling to or from the test structure which are down-converted by intermediate frequency (IF) sections of the network analyzer where the signals are filtered, amplified and digitized for further processing and display. The result is a plurality of s-parameters (scattering parameters), the ratio of a normalized power wave comprising the response of the DUT to the normalized power wave comprising the stimulus supplied by the signal source.

At higher frequencies, the preferred interconnection for communicating signals between the test structure, the source of the stimulating test signal and the sink for the output signals of the test structure is coaxial cable. The transition between the coaxial cable and the probe pads of the test structure is preferably provided by movable probes having one or more conductive probe tips 44 that are arranged to be co-locatable with respective probe pads of the test structure. The test instrumentation and the test structure can be temporarily interconnected for probing by bringing the probe tips of the probe(s) into contact with the probe pads of the test structure. Typically, two probes 46, 48 are utilized when probing a differential or balanced test structure. A differential gain cell requires two input probe pads 50, 52 and two output probe pads 54, 56 for the even and odd mode components of the differential input and output signals and a bias probe pad 58 through which the transistors of the cell are biased. The probe pads of differential test structures are arranged to avoid physical contact and crosstalk between the two probes during simultaneous engagement with the test structure. As a result, the probe pads of a differential test structure occupy a significant portion of the useable surface of a wafer and, typically, must be fabricated in an area of the wafer in which one or more dies containing marketable ICs could otherwise be fabricated. However, test structures serve no purpose after the dies containing the marketable ICs are singulated and manufacturers of ICs are under continuous cost pressure to maximize the number of marketable ICs that are manufactured on each wafer.

What is desired, therefore, is a compact, simplified probe measurement system for communicating differential signals between a test instrument and a test structure.

DETAILED DESCRIPTION OF PREFERRED EMBODIMENTS

Circuits utilizing differential signaling are becoming increasingly common for a wide range of higher frequency applications. The benefits of differential signaling or balanced devices include lower power levels, faster state transition for binary devices, good immunity from noise, minimal susceptibility to electromagnetic coupling at higher frequencies, and greater tolerance of poor grounding conditions which are commonly encountered when integrated circuits are operated at high frequencies. The integrity of the process used to manufacture marketable integrated circuits (ICs) is tested by fabricating a plurality of test structures on the wafer using the same process that is used to fabricate the ICs. Characteristics of the marketable ICs are inferred by stimulating the test structure with a test instrument generated signal and capturing the response of the test structure. While test structures are typically simple circuits, the response of similar devices included in the more complex marketable ICs is expected to be similar to the response of the test structure because the devices in the marketable ICs and similar devices in the test structures are fabricated with the same process.

While differential signaling provides a number of advantages, particularly at higher frequencies and in noisier environments, the use of balanced or differential devices in the DUTs of test structures is limited. The probe pads of differential test structures are arranged so that two probes can simultaneously engage the probe pads while avoiding physical contact and crosstalk between the probe tips. The probe pads are spread over a significant area of the surface of the wafer and, typically, must be fabricated in an area of the wafer that could otherwise accommodate one or more dies containing marketable ICs. However, test structures serve no purpose after the dies containing the marketable ICs are singulated and manufacturers of ICs are under continuous cost pressure to maximize the number of marketable ICs manufactured on each wafer. The inventors concluded that the number of dies comprising marketable ICs fabricated on a wafer could be increased if the differential test structure could be connected to the test instrumentation with a single probe enabling rearrangement of the probe pads and fabrication of the test structure in a saw street between dies.

Figure 1:
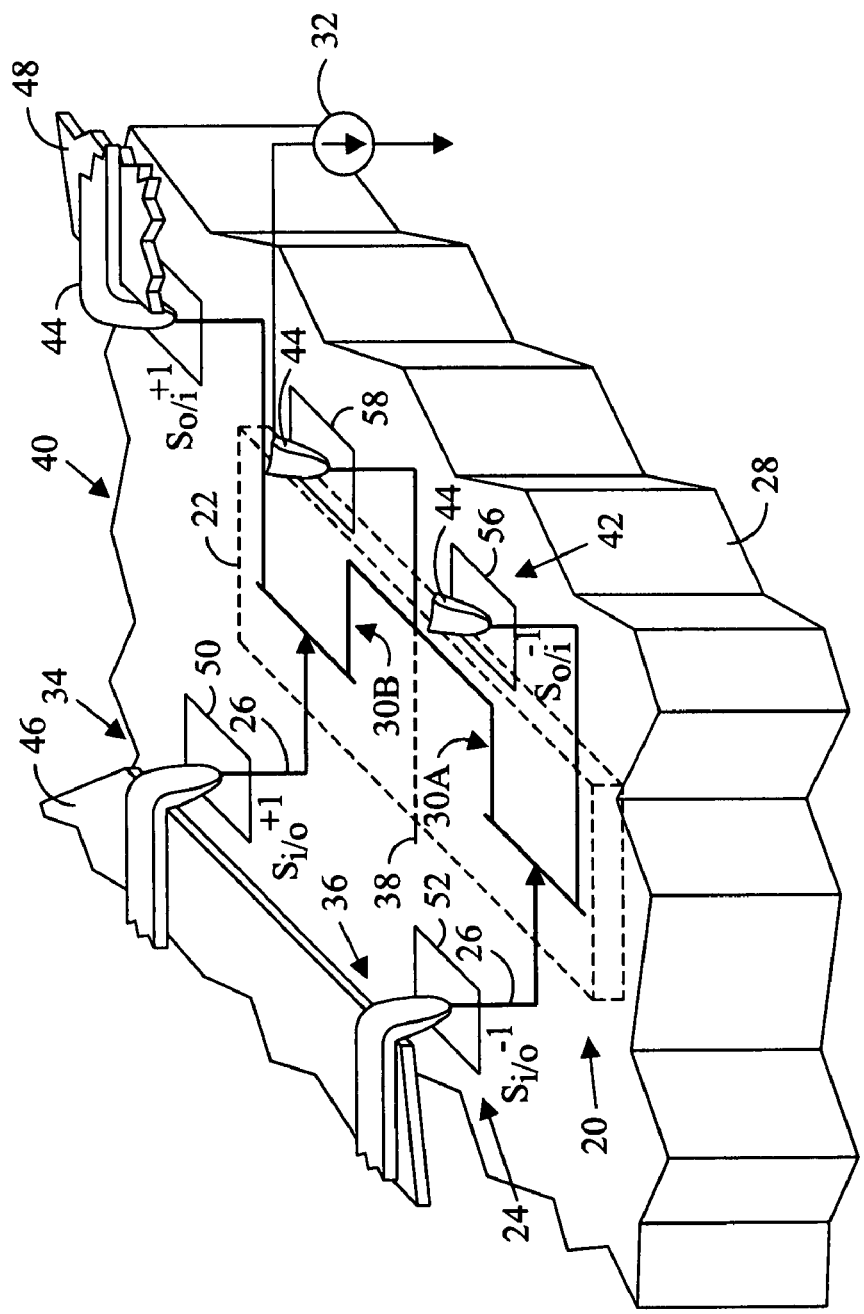
FIG. 1 is a perspective illustration of a portion of a wafer including a differential test structure having probe pads arranged for engagement by a two probes.
Figure 2:
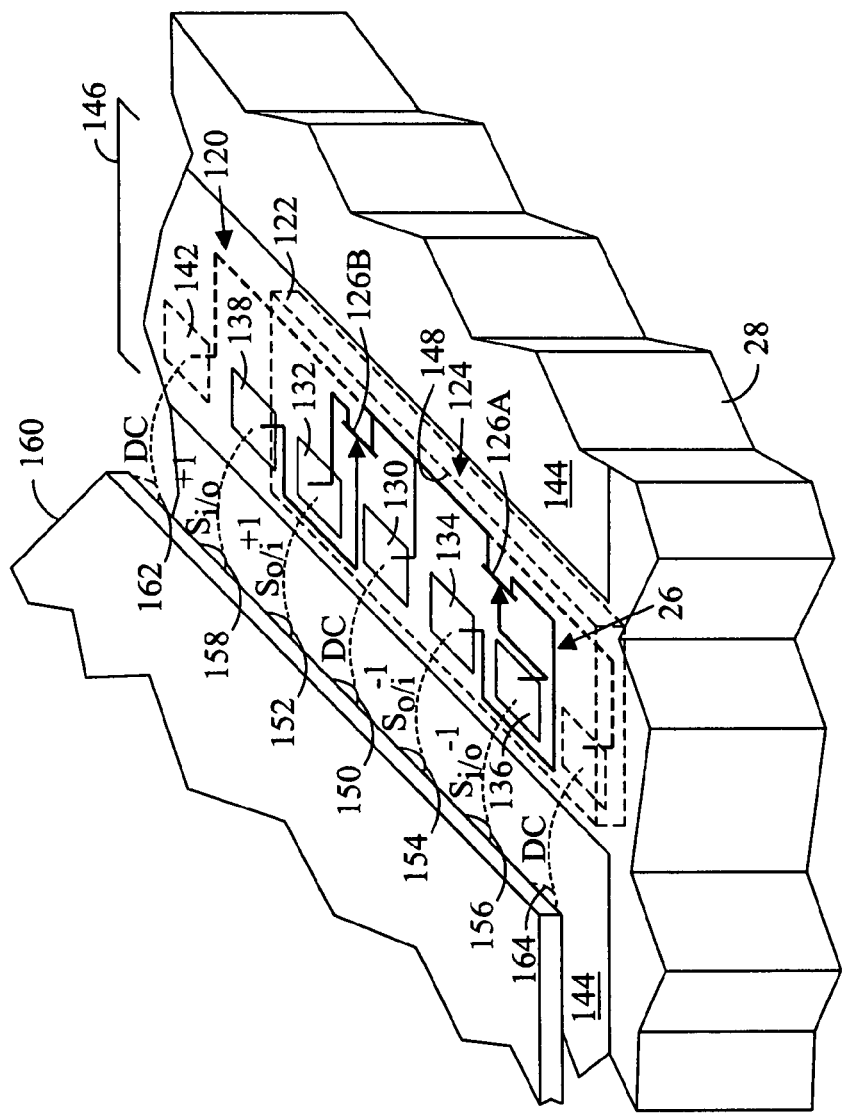
FIG. 2 is a perspective illustration of a portion of a wafer including a differential test structure engageable by a single probe having a linear array of probe tips.

Referring in detail to the drawings where similar parts are identified by like reference numerals, and, more particularly to FIG. 2, the test structure 120 comprises a DUT 122 that includes a differential gain cell 124 that is responsive to a differential mode input signal. The differential mode input signal comprises an even mode component ($S_i^{+1}$) and an odd mode component ($S_i^{-1}$) that has substantially the same amplitude as the even mode component but which is opposite in phase of the even mode component. The differential gain cell 124 comprises two substantially identical field effect (JFET) transistors 126A and 126B. However, a DUT typically comprises components corresponding to the components utilized in the marketable integrated circuits fabricated on the wafer and other types of transistors, such as bipolar junction (BJT) transistors or MOSFET transistors can be used in the construction of the differential gain cell of a test structure.

The five probe pads 130, 132, 134, 136 and 138 through which the DUT is biased and through which the components of the differential signals are communicated to and from the test structure are arranged in a substantially linear array reducing the breadth of the probe pad arrangement and enabling placement of the test structure between dies 144 in a saw street 146 (indicated by a bracket) that is only slightly wider that the width of a probe pad. The source terminals of the transistors of the differential gain cell are interconnected as a transistor bias terminal 148. The bias terminal is interconnected to the bias bond or probe pad 130 located in the center of the linear array of probe pads. The gates of the transistors comprise input terminals of the DUT and are connected to respective signal input probe pads 136, 138. The drains of the transistors of the differential gain cell comprise the output signal terminals of the DUT and are interconnected to the output signal probe pads 132, 134. Typically, the DUT 122 is relatively small and comprises circuit elements that are fabricated beneath the surface of the wafer. The probe pads are conductively connected to the terminals of the DUT by vias 26 that extend from the probe pads on the surface of the wafer to the subsurface strata in which the circuit elements of the DUT and the corresponding circuit elements of the integrated circuit have been fabricated.

Figure 3:
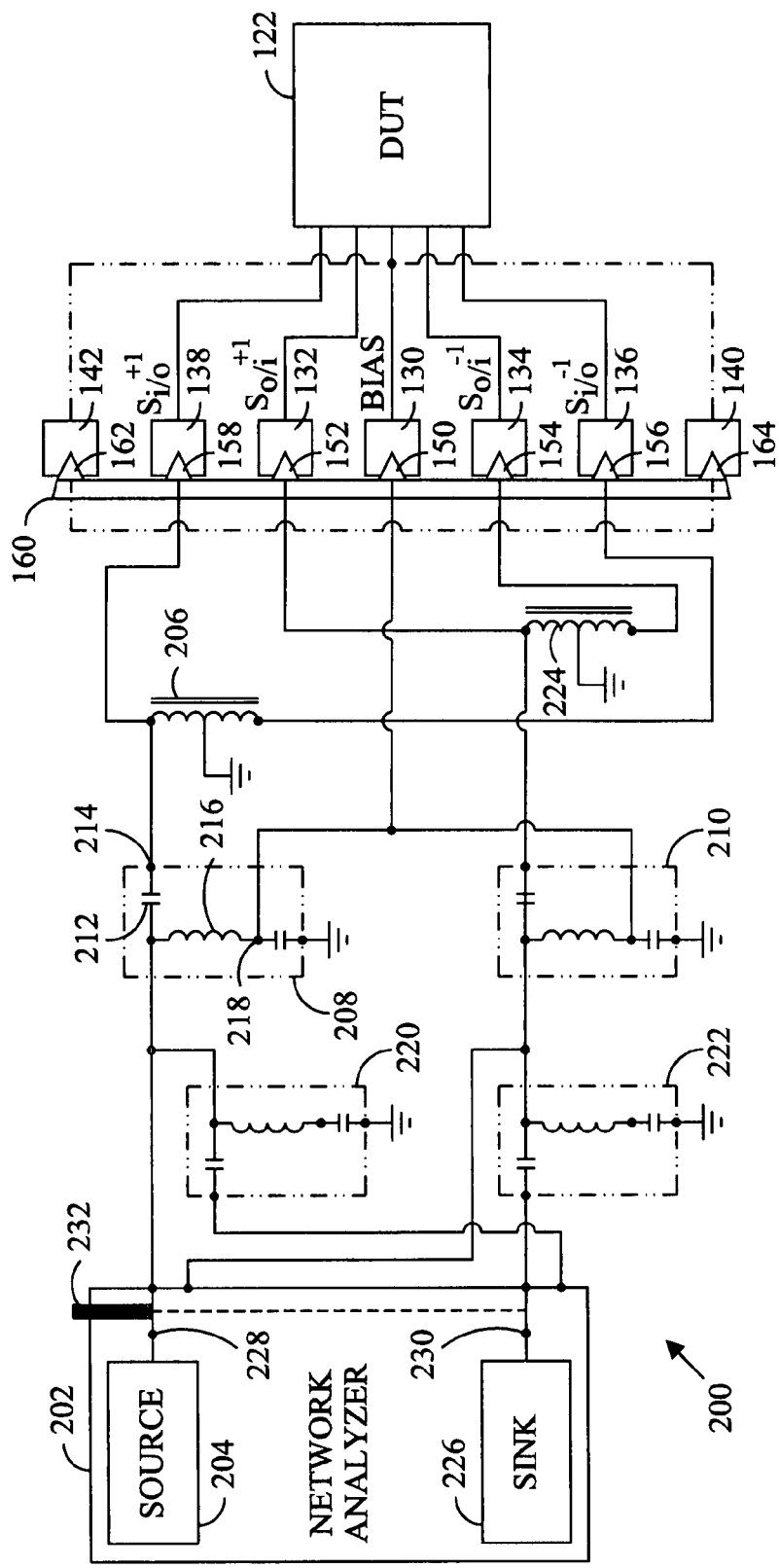
FIG. 3 is a schematic diagram of a probe system utilizing a two-port network analyzer for testing a differential test structure.

Referring to FIG. 3, at higher frequencies the DUT, for example the DUT 122, of a differential test structure is typically stimulated with a signal generated by a network analyzer. A typical two-port network analyzer 202 outputs a single ended (ground referenced) modulated signal, which may include a DC offset, at the port 228 of an RF signal source 204. In the probe measurement system 200, the single ended input signal is conducted to a balun 206 which converts the single ended signal to a balanced or differential signal comprising differential components having substantially the same amplitude but opposite phase. The two components of the differential input signal are transmitted to respective bias tees 208, 210 which separate the modulated portion of the input signal from the DC portion. A bias tee comprises a capacitor 212 in series with an RF port 214 that blocks transmission of the DC component of the input signal from the RF port. An inductor 216, in series with a DC port 218 of the bias tee blocks, the modulated signal but permits transmission of the DC portion of the input signal to the DC port. The modulated components of differential input signal, $S_i^{+1}$ and $S_i^{-1}$, are communicated to respective probe tips 156, 158 via interconnections to the RF ports of the respective input signal bias tees. The probe tips 156, 158 are arranged on a probe 160 which is movable relative to the test structure so that the probe tips may be co-located with the respective input signal probe pads 136, 138 connected to the DUT 122 of a test structure.

Similarly, the differential output signal components ($S_o^{+1}$ and $S_o^{-1}$) which are controlled by the input signals at the respective input terminals of the differential gain cell are communicated from the respective probe pads 132, 134 to respective output signal probe tips 152, 154 that are interconnected to respective bias tees 220, 222. The modulated portions of the differential output signal components are transmitted to a balun 224 while DC portions of the differential output signal components are blocked from the network analyzer by the capacitors 212 in series with the RF ports of the bias tees. The balun converts the differential signal components to a single ended signal which is transmitted to the port 230 of a signal sink 226 of the network analyzer. The signal sink typically comprises one or more intermediate frequency (IF) sections where, typically, the signals are filtered, amplified and digitized for further processing and display. A switch 232 enables the connections between the probe tips and the respective ports of the signal source and the signal sink to be reversed.

The transistors of the differential gain cell of the DUT are biased by a DC current that is communicated between the DC ports of the bias tees and bias probe pad 130 by a bias probe tip 150 of the probe. An alternative embodiment of the test structure 122 includes additional probe pads 140, 142 located distal of the respective ends of the linear array of five probe pads and which are interconnected with the bias probe pad 130. Spatially corresponding additional probe tips 162, 164, interconnected with the centrally located bias probe tip 150, are included in an alternative embodiment of the probe 160 to engage the additional probe pads of the alternative test structure probe pad arrangement.

Figure 4:
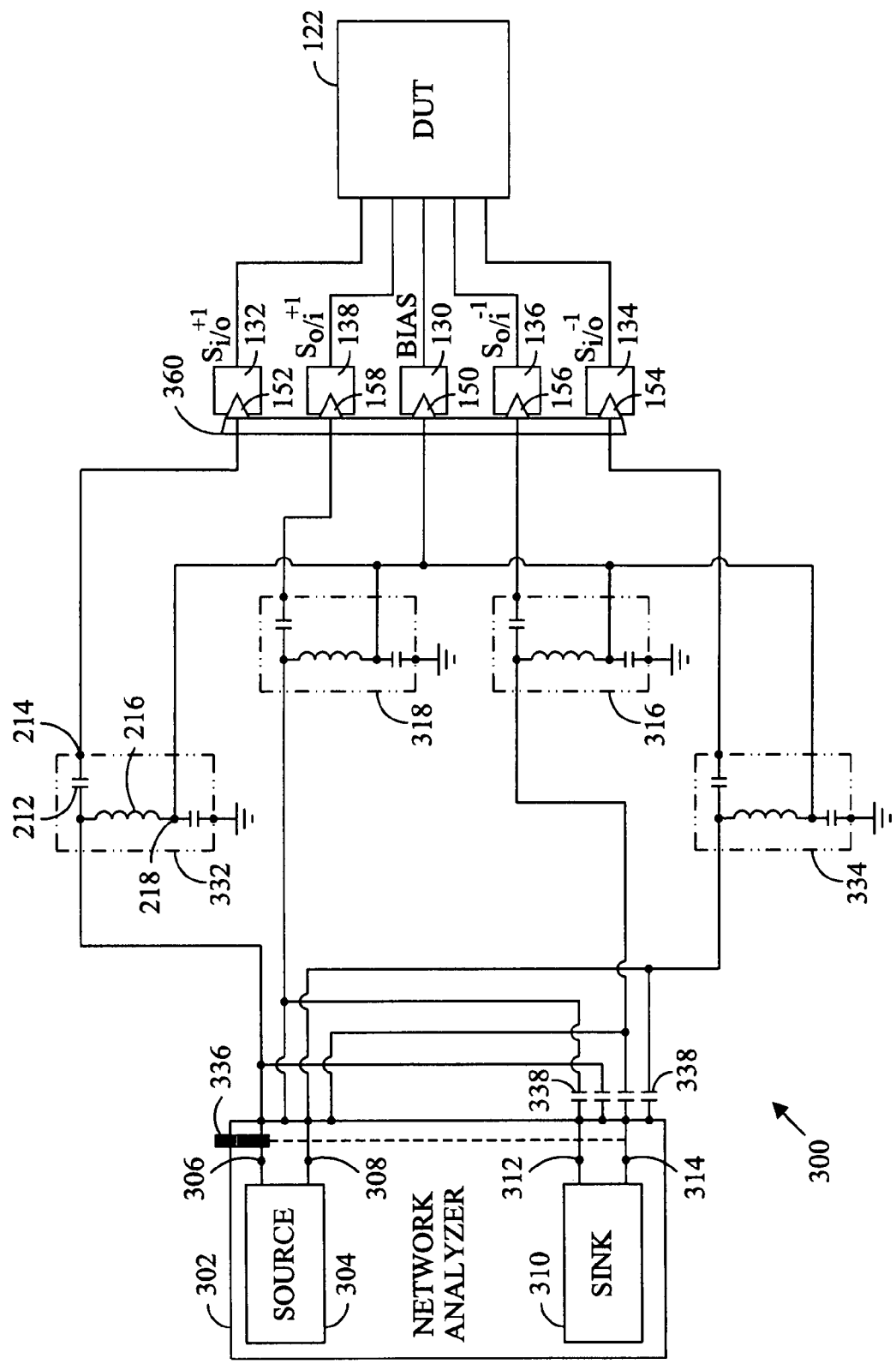
FIG. 4 is a schematic diagram of a probe system utilizing a four-port network analyzer for testing a differential test structure.

While many network analyzers output only single ended signals, the accuracy of a probe system utilizing single ended signals to probe a differential test structure is limited because the reference plane for de-embedding the test structure is located at the ports of the baluns nearest the DUT. Referring to FIG. 4, a four port network analyzer 302 can output differential signals directly permitting mixed mode analysis and de-embedding of the DUT at its terminals. In the probe measurement system 300, the differential input signal components, including a DC offset, are output at the ports 306, 308 of the signal source 304 and transmitted to respective bias tees 316, 318. The capacitor 212 in series with the RF port of a bias tee blocks the transmission of the DC component of the input signal from the RF port. The modulated portion of the differential input signal components ($S_i^{+1}$ and $S_i^{-1}$) are communicated from the RF port of the respective bias tee 316, 318 to a respective probe tip 156, 158 of the probe 360. Each of the probe tips is co-locatable with a respective one of the probe pads 136, 138 that is interconnected to conduct an input signal component to the DUT. Similarly, the differential output signal components ($S_o^{+1}$ and $S_o^{-1}$) are transmitted from respective probe pads 132, 134 to respective probe tips 152, 154 and then to respective bias tees 332, 334. The capacitors of the bias tees in series with the RF port, block the transmission of DC from the bias tees to the two signal input ports 312, 314 of the signal sink 302. A switch 336 enables reversal of the connections to the signal source and the signal sink and capacitors 338 protect the signal sink from a DC component included in the signal transmitted by the signal source. The outputs at the DC ports of the bias tees are transmitted to the bias probe tip 150 which is arranged for contact with the bias probe pad 130 of the DUT. FIG. 4 illustrates another alternative arrangement of probe pads and probe tips where the output signals are sourced from the probe pads at the ends of the linear array of five probe pads and the input signals are transmitted to the probe pads immediately adjacent to the central probe pad of the linear array of five probe pads.

Figure 5:
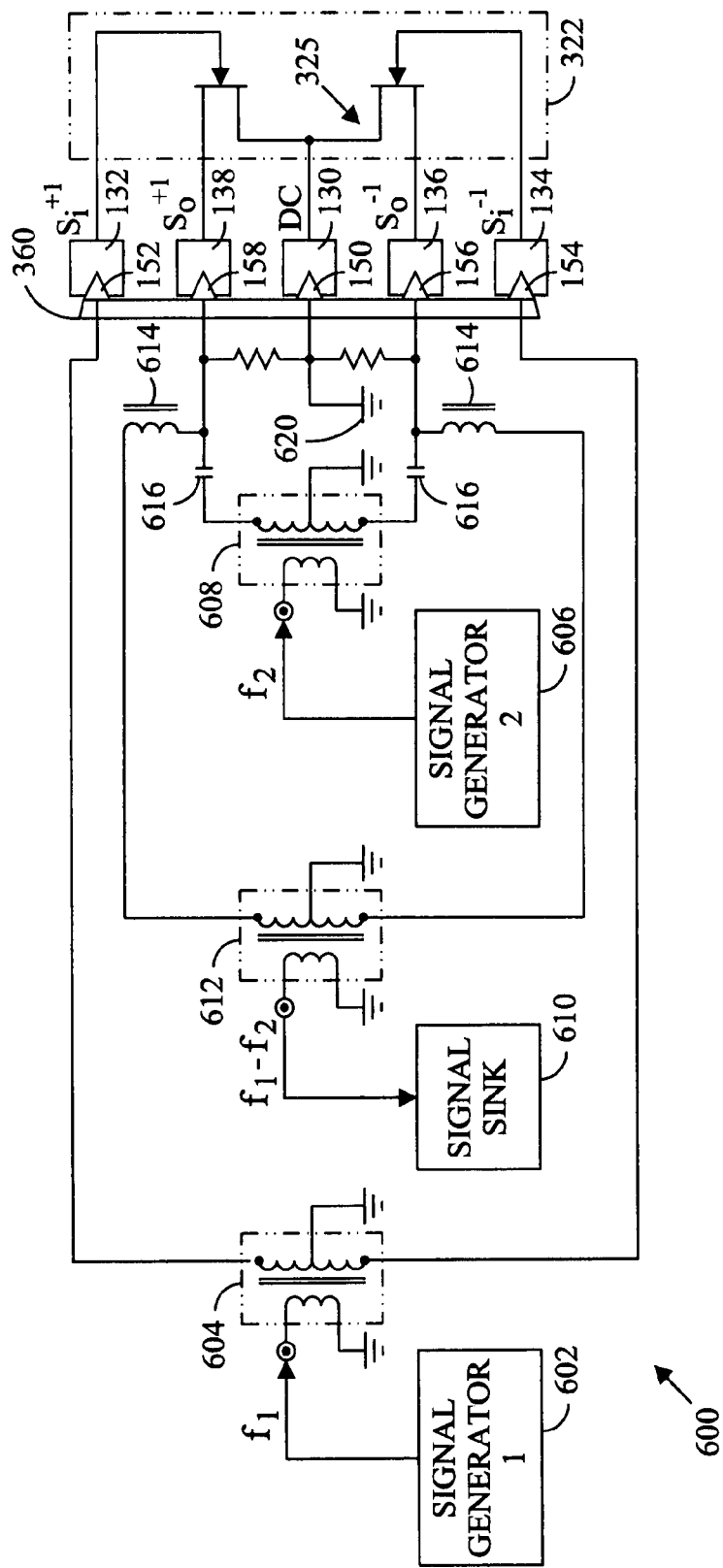
FIG. 5 is a schematic diagram of a probe system utilizing a differential test structure as a frequency converter.

A network analyzer is expensive and the cost of a probe measurement system that includes a network analyzer substantially impacts the cost of producing high frequency ICs. The inventors realized that the differential gain cell could be utilized as a passive frequency converter enabling parametric RF testing with a less costly probe measurement system that utilizes a low frequency spectrum analyzer rather than a more costly network analyzer. Referring to FIG. 5, in the probe measurement system 600 a first signal generator 602 transmits a single ended, modulated signal having a frequency ($f_1$) to a first balun 604. The balun converts the single ended signal to a differential signal comprising even and odd mode components of substantially equal amplitude and opposite phase angle. The differential signal components are conducted to a probe 360 including a plurality of probe tips arranged to be co-locatable with the probe pads of a test structure including a DUT 322 comprising a differential gain cell 325. The components of the differential signals from the first signal generator are conducted by probe tips 152 and 154 to respective probe pads 132 and 134 which are connected to the gates of the transistors of the differential gain cell. The transistors of the differential gain cell are biased by the connection of their source terminals to ground 620 through the probe pad 130 and the contacting probe tip 150.

A second signal generator 606 outputs a second single ended, modulated signal having a second frequency ($f_2$) to a second balun 608 which converts the single ended signal to a differential signal comprising components of substantially equal amplitude and opposite phase. The signal is transmitted to the drains of the transistors of the differential gain cell through high pass filter capacitors 616 which block the transmission of low frequency signals. The outputs of the DUT which are controlled by the input signals at the respective gates of the transistors are conducted to the output signal probe pads 136 and 138 and respective contacting probe tips 156, 158. The respective components of the signals from the second signal generator and the output terminals of the DUT, having respective second and first frequencies, are combined producing respective components of a differential combined output signal. The components of the combined output signal comprise an upper frequency ($f_1+f_2$) combined output signal band and a lower frequency ($f_1-f_2$) combined output signal band. The differential components of the lower frequency combined output signal band are separated from the upper frequency combined output signal band by the low pass filters 614 and converted to a single ended signal by a balun 612. The lower frequency ($f_1-f_2$), single ended signal is conducted to a signal sink 610 for analysis, such as comparison with the results obtained by testing other differential gain cells having known characteristics, and display. Utilizing the differential test structure as a frequency converter enables stimulation of the test structure with a high frequency signal but permits analyzing the result with a relatively less expensive, lower frequency capable, signal sink, such as a spectrum analyzer.

Figure 6:
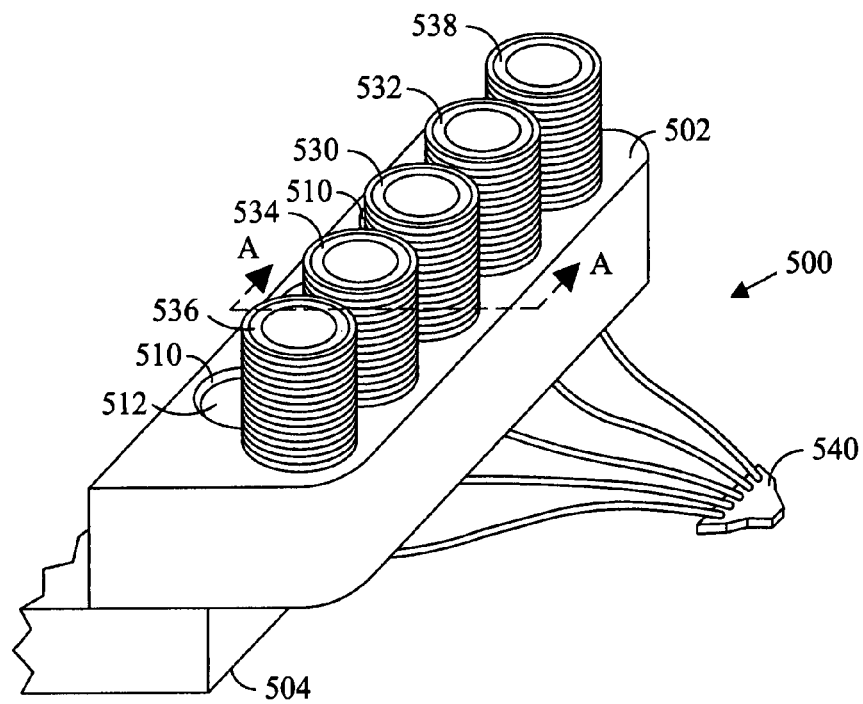
FIG. 6 is a perspective view of a probe for testing a differential test structure.
Figure 7:
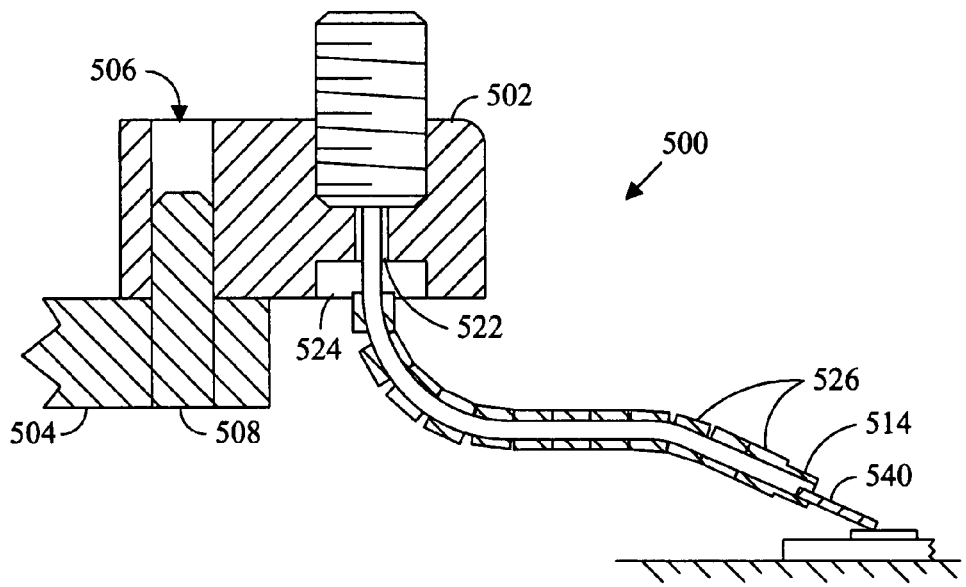
FIG. 7 is a section view of the probe of FIG. 6 along line A-A.
Figure 8:
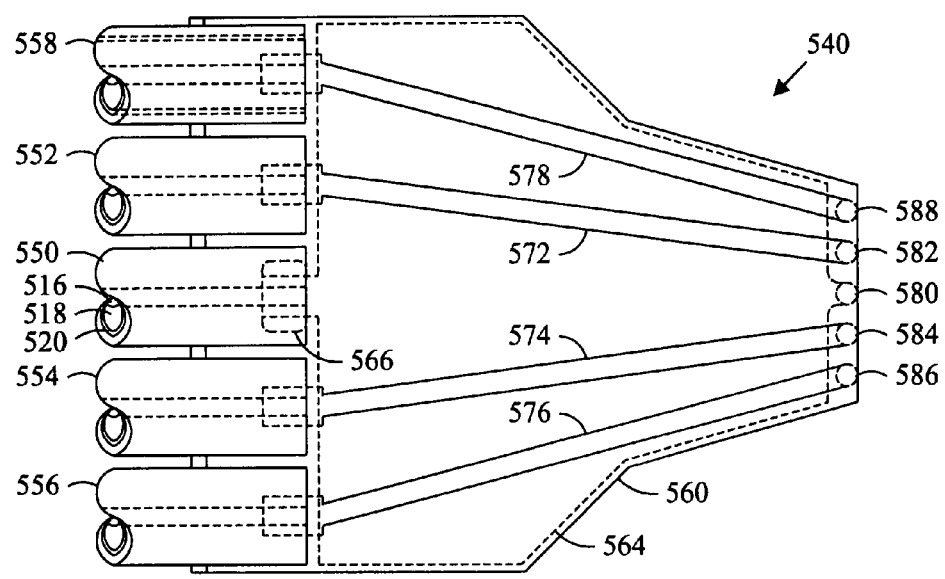
FIG. 8 is a top view of a probe head of a probe for engaging a differential test structure.

Typically, coaxial cable interconnects the network analyzer, other test instrumentation and the probe which provides the transition from the signal paths provided by the coaxial cable to the signal paths comprising the probe pads fabricated on the surface of a wafer. Referring FIGS. 6, 7 and 8, the probe 500 comprises a support block 502 which is suitably constructed for connection to a movable probe supporting member 504 of a probe station. For example, the support block 502 includes an aperture 506 for engagement by a snugly fitting alignment pin 508 that projects vertically from the probe supporting member. In addition, the support block includes a pair of countersunk apertures 510 to accept a pair of fastening screws 512 arranged to engage threaded holes in the probe supporting member and secure the probe to the probe supporting member.

The probe includes a plurality of input ports 530, 532, 534, 536, 538 which, in the embodiment depicted, comprise sparkplug type, K connectors. This connector enables the external connection of an ordinary coaxial cable to an input port permitting a well shielded high frequency transmission channel to be established between the probe and the test instrument. If desired, other types of connectors can be used, such as a 2.4 mm. connector, a 1.85 mm. connector or a 1 mm. connector.

In the depicted embodiment, a semi-rigid coaxial cable 514 is connected at its rearward end to each K connector comprising one of the ports of the probe. These coaxial cables preferably include an inner conductor 516, an inner dielectric 518 and an outer conductor 520 and are preferably of phase-stable low-loss type. The coaxial cable may likewise include other layers of materials, as desired. To prepare the rearward ends of the cables for connection to an appropriate K-connector, the rearward end is stripped to expose the inner conductor, and this inner conductor is temporarily held inside a dummy connector while the adjacent outer conductor is soldered within a bore 522 formed in the primary support block. A recess 524 in the support block below this bore provides access to facilitate the soldering process. The dummy connector is then removed and a K-connector is screwed into each of the threaded openings formed in the block above the bore so as to effect electrical connection between the connectors and the coaxial cables. A thread locking compound may be applied to the threads of the K-connectors prior to their installation to ensure a secure physical connection.

The forward ends of the cables remain freely suspended and, in this condition, serve as a movable support for a probe head 540 of the probe. Before being connected to the K-connector, the cables are bent along first and second intermediate portions in the manner shown so that a generally upwardly curving 900 bend and a downwardly curving bend, respectively, are formed in the cable. The protruding ends of the coaxial cables may be slidably inserted into a tube 526 comprising semi-flexible microwave-absorbing material. One material used for forming the tube comprises iron and urethane. The semi-flexible tube of microwave absorbing material serves to substantially reduce the levels of microwave energy that travel along the outer conductor of the semi-rigid cable.

Figure 9:
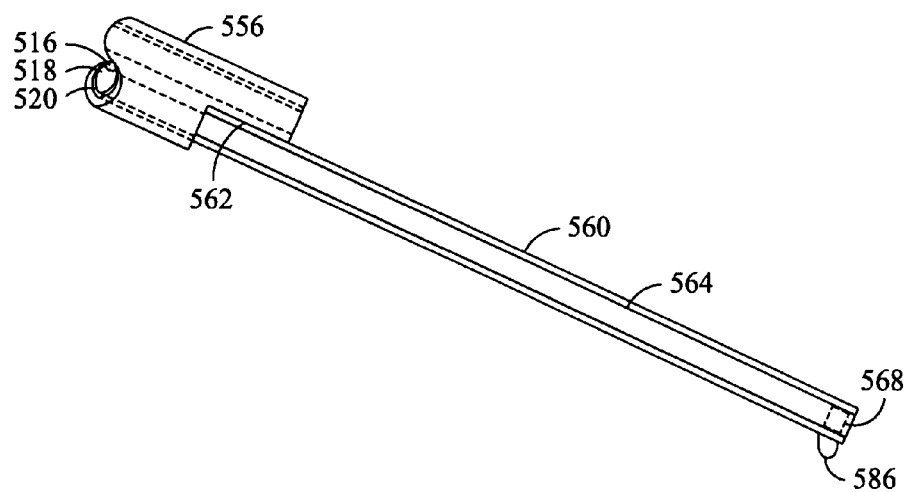
FIG. 9 is an elevation view of the probe head of FIG. 8.
Figure 10:
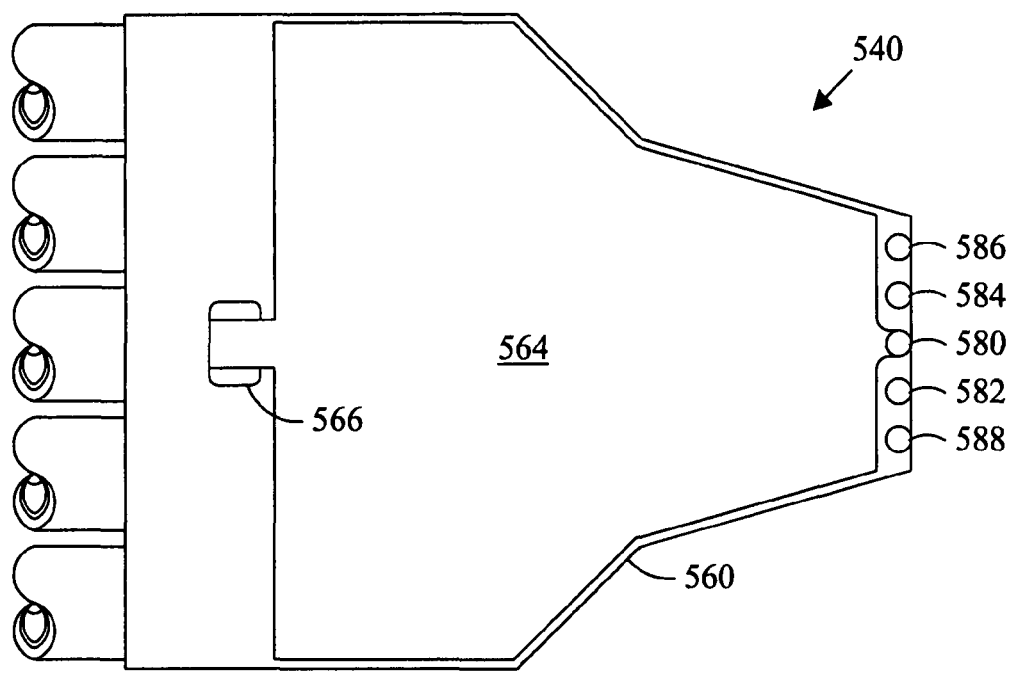
FIG. 10 is a bottom view of the probe head of FIG. 8.

Referring also to FIGS. 9 and 10, the probe includes a microstrip style probe head 540 that includes a dielectric plate 560 having generally planar upper and lower surfaces that is affixed to the forward ends of the coaxial cables 550, 552, 554, 556, 558. The underside of each cable is cut away to form a shelf 562, and the dielectric plate is affixed to the shelf. Alternatively, the dielectric plate may be supported by an upwardly facing shelf cut away from the cable or the end of the cable without a shelf. A conductive bias layer 564 comprising a thin, generally planar conductive material is affixed to the bottom of the dielectric plate. A thin, generally planar, bias layer has a low profile that is less likely to interfere with the ability to effectively probe a DUT by accidentally contacting the device. A via 566, electrically couples the bias layer to the center conductor of the coaxial cable 550 connected to the bias input port 530 of the probe. The bias layer may be provided with any DC voltage potential suitable for biasing the transistors of the differential gain cell of the DUT. The bias layer preferably covers substantially all of the lower surface of the dielectric plate. Alternatively, the bias layer may cover a portion greater than 50%, 60%, 70%, 80%, 90% of the surface of the dielectric plate and/or the region directly under a majority (or more) of the length of a conductive signal trace secured to the opposing side of the plate.

One or more conductive signal traces are supported by the upper surface of the dielectric plate. The conductive traces may be deposited, using any technique, or otherwise secured on the upper surface of the dielectric plate. A conductive signal trace is electrically interconnected to the inner conductor of each of the coaxial cables 552, 554, 556, 558. The respective interconnected conductive traces 572, 574, 576, 578 normally conduct the components of the differential signals to and from the DUT. Separated by dielectric material, each conductive trace, together with the bias layer, forms one type of a microstrip transmission structure. Other layers above, below, and/or between the bias layer and the conductive trace(s) may be included, if desired.

Conductive vias 568 passing through the dielectric plate enables transference of the signal path from the conductive traces on the upper surface of the plate to the lower surface of the plate. The conductive via substantially reduces the capacitance of the signal path compared to a conductive finger extending over the end of the dielectric plate. The conductive via provides a path from one side of the plate to the other that is free from an air gap between the via and the dielectric for at least a majority of the thickness of the plate.

The lower surface of the dielectric plate includes a plurality of contact bumps or probe tips 580, 582, 584, 586, 588 that are respectively electrically connected to the bias layer or to the vias extending from respective conductive traces on the upper surface of the dielectric plate. The probe tips are arranged in a linear array with the centroids of the lower ends of the probe tips being substantially aligned and arranged generally parallel to forward edge of the probe head. The probe tips are spatially arranged proximate the adjacent tip(s) in the linear array so as to be co-locatable with the respective probe pads that conduct the signals for the test structure that is to be probed. It is to be understood that the probe tips may take any suitable form, such as a bump, a patterned structure, or an elongate conductor. The bias layer may laterally encircle one or more of the probe tips or may extend beyond one or more of the probe tips to reduce crosstalk with other probes.

Figure 17:
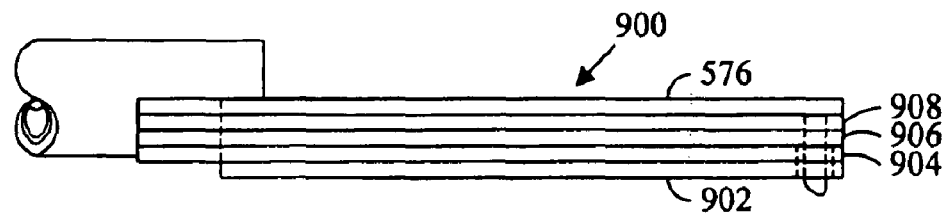
FIG. 17 is an elevation view of the probe head of FIG. 16.
Figure 16:
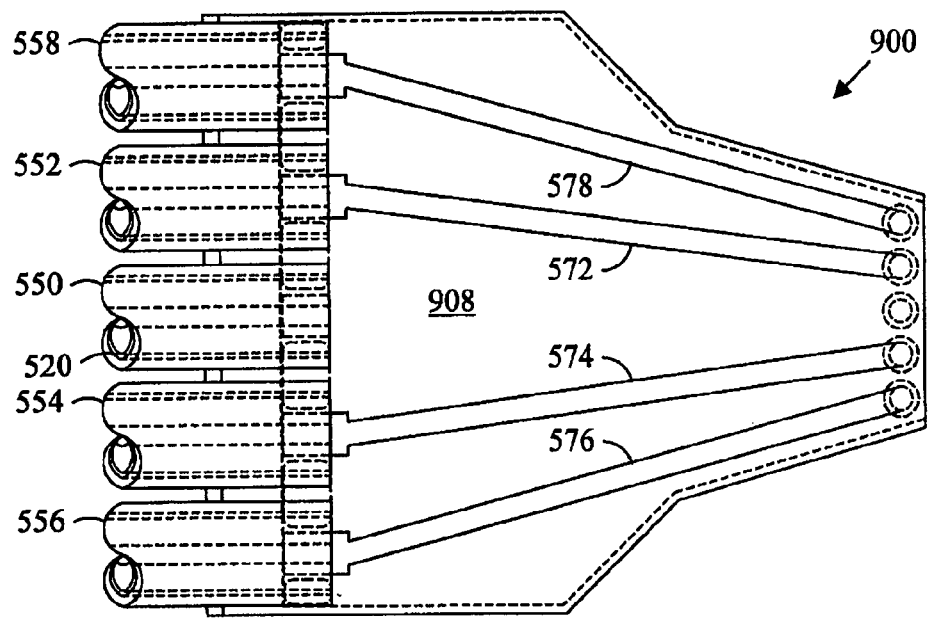
FIG. 16 is a top view of an additional embodiment of a probe head.
Figure 18:
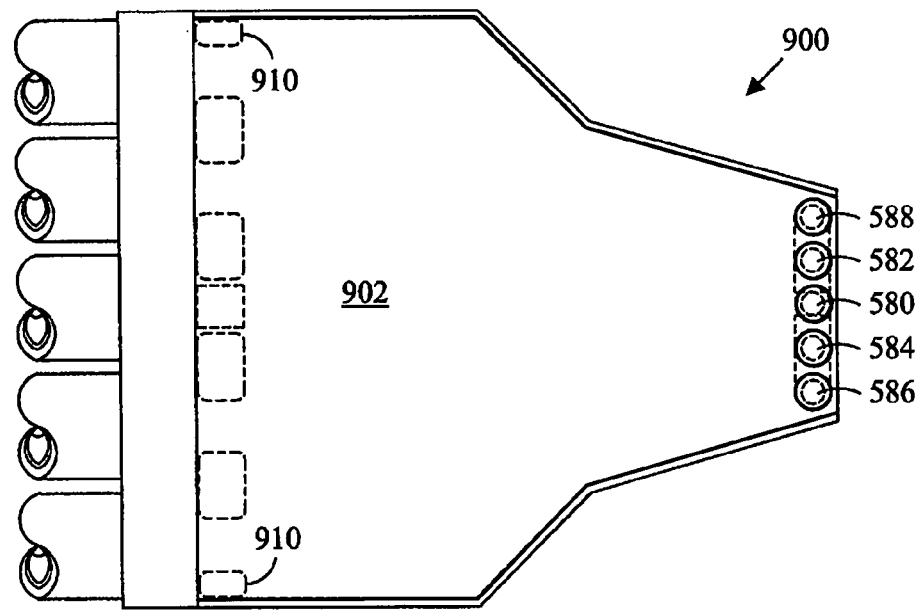
FIG. 18 is a bottom view of the probe head of FIG. 16.

Referring to FIGS. 16, 17 and 18, in an additional embodiment of a probe head 900 for testing a differential test structure, a conductive shield 902, which is preferably planar in nature, is affixed to the bottom of a lower dielectric plate 904. The conductive shield, may be for example, a thin conductive material (or otherwise) that is affixed to the lower plate 904. A shield of thin generally planar conductive material is less likely to accidentally contact the test structure when the probe tips are contact with the probe pads. The conductive shield is electrically coupled to an outer conductor 520 of at least one of the coaxial cables 550, 552, 554, 556, 558 by a via 910 to form a ground plane. The outer conductor is typically connected to ground, though the outer conductor may be provided with any suitable voltage potential (either DC or AC). The conductive shield 902 preferably covers substantially all of the lower surface of the lower dielectric plate 904. Alternatively, the conductive shield 902 may cover greater than 50%, 60%, 70%, 80%, 90%, and/or the region directly under a majority (or more) of the length of a conductive signal trace on the opposing side of the probe head. The bias voltage for the transistors of the DUT is conducted to the bias probe tip 580 through a middle conductive layer 906 which is conductively connected to the bias probe tip and to the center conductor of the coaxial cable 550 by vias. Overlaying the middle conductive layer, an upper dielectric plate 908 includes an upper surface to which are secured the traces 572, 574, 576, 578 that conduct the components of the differential input and output signals. The traces are in contact with the center conductors of the respective coaxial cables and are connected to the respective probe tips by vias extending from the upper surface of the upper dielectric plate to the probe tips.

Figure 11:
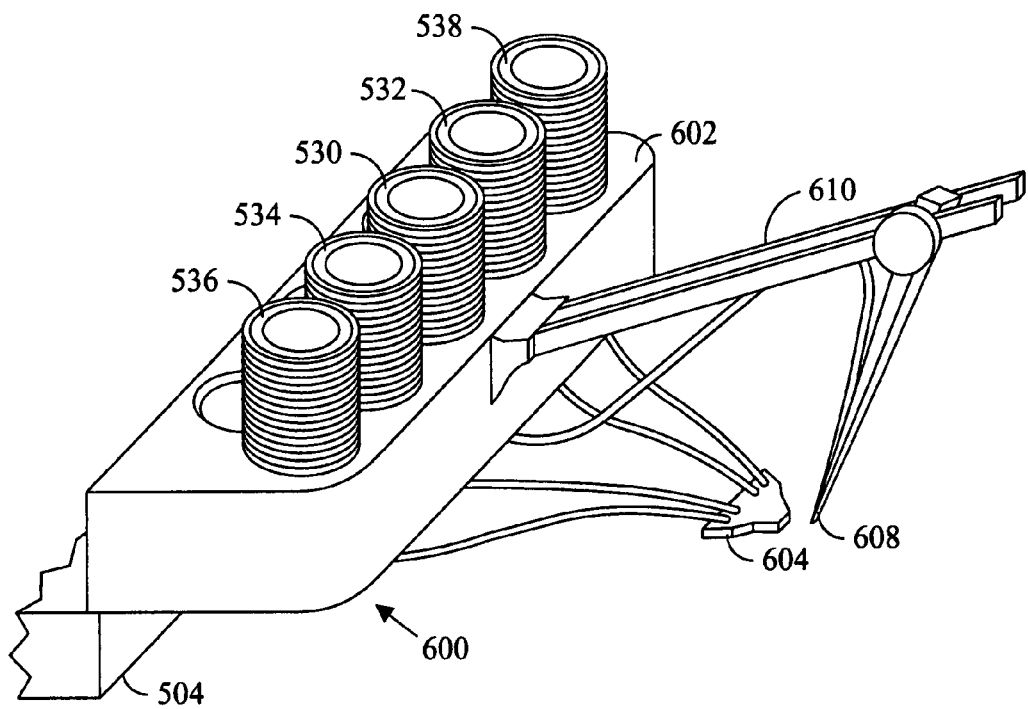
FIG. 11 is a perspective view of a probe including a linear array of four probe tips and a fifth probe tip.
Figure 12:
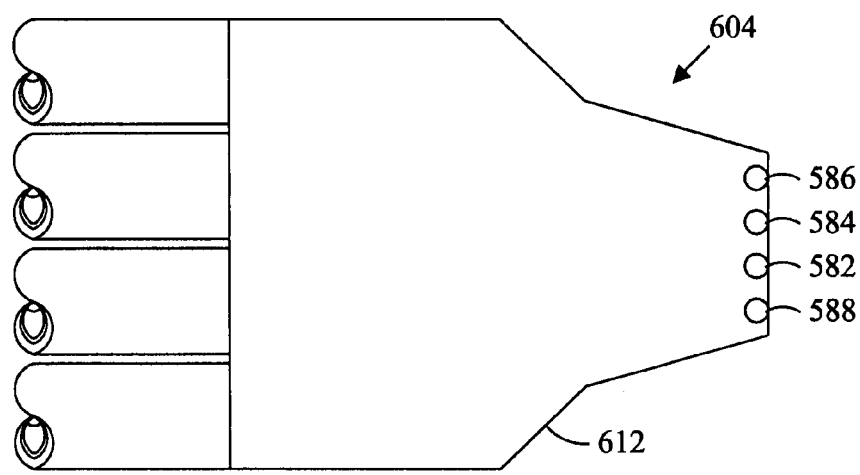
FIG. 12 is a bottom view of a probe head of the probe of FIG. 11.

Referring to FIGS. 11 and 12, in another embodiment of a probe for a testing a differential test structure, the probe 600 comprises support block 602 securable to the probe supporting member 504. A plurality of ports 532, 534, 536, 538 are attached to the support block and electrically connected to a plurality of coaxial cables that extend to a probe head 604. The connector of the centrally located port 530 is electrically connected to a coaxial cable 606 which extends to a probe tip 608 supported by an arm 610 attached to the support block 602. The probe head 604 comprises a dielectric plate 612 which supports four probe tips 582, 584, 586, 588 arranged in a linear array and which conduct the components of the differential input and output signals to and from the test structure. The bias for the transistors of the test structure is conducted from the port 530 to a probe pad of a test structure by a probe tip 608 which is proximate the third and fourth probe tips of the linear array of probe tips 582, 584, 586, 588 but not in linear alignment with the probe tips included in the linear array through which the components of the differential signals are conducted.

Figure 13:
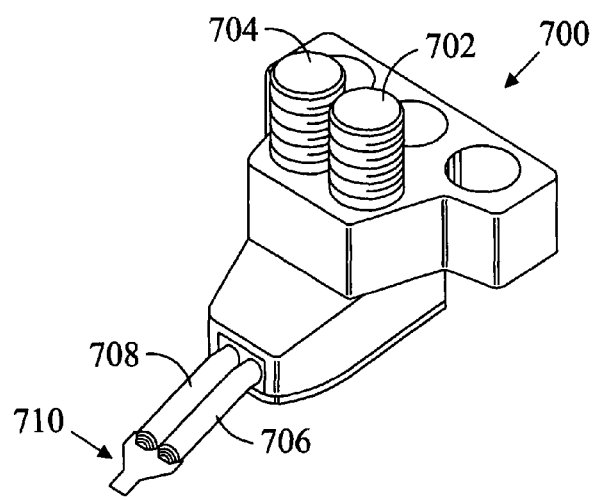
FIG. 13 is a perspective view of an embodiment of a differential signal probe comprising cables including having a plurality of conductors.
Figure 14:
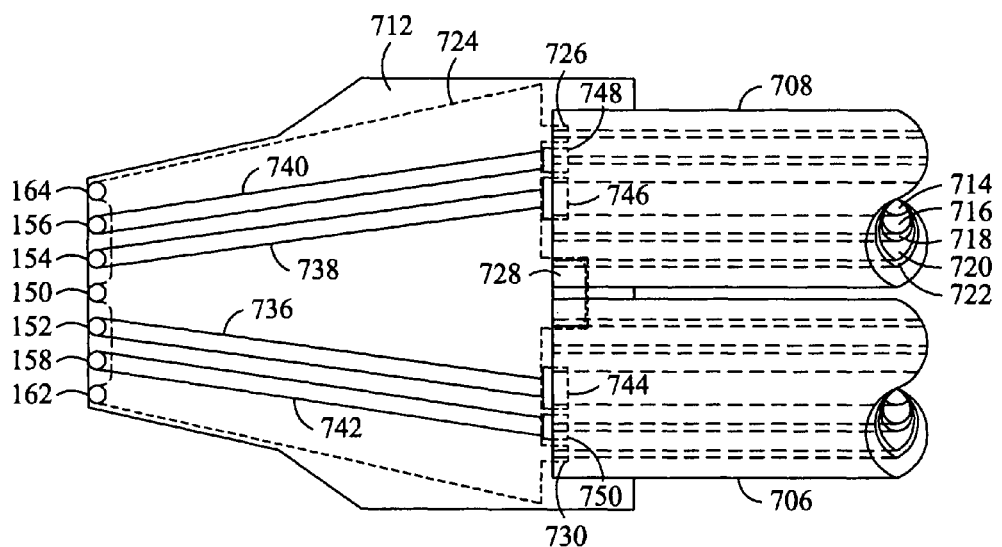
FIG. 14 is a top view of a probe head of the probe of FIG. 13.

Referring to FIGS. 13 and 14, the ports 702, 704 of the probe 700 of alternative embodiment are arranged to provide electrical interconnections to a coaxial cable having more than two conductors. For example, the conductors may be triaxial cables having three conductors separated by intervening dielectric layers. The triaxial cables 706, 708 are electrically interconnected to the respective ports, at least one of which is insulated from the support block, at their rearward ends. The freely suspended forward support ends of the triaxial cables support a probe head 710 comprising a dielectric plate 712 secured to a shelf formed in each of the ends of the two triaxial cables. The removal of a portion of the triaxial cable to form the shelf exposes the inner conductor 714, the inner dielectric layer 716, the intermediate conductor 718, the outer dielectric layer 720 and the outer conductor 722 that comprise the cable. The conductors of the triaxial cables are interconnected to respective probe tips formed on the lower surface of the dielectric plate. For example, if the DC bias is conducted to the probe head through the outer conductors of the triaxial cables, the central probe tip 150 can be interconnected to the outer conductors by a bias layer 724 supported on the lower surface of the dielectric plate that is electrically interconnected to the central probe tip 150 and electrically interconnected to the outer conductors by vias 726, 728, 730 extending through the dielectric plate. In addition, the linear array of probe tips includes probe tips 162 and 164 for engaging probe pads 142 and 140 of an alternative embodiment comprising seven probe pads and are also interconnected to the bias layer. The components of the differential input and output signals are conducted from the respective inner conductors and respective intermediate conductors to the probe tips 152, 154, 156 and 158 by traces 736, 738, 740, 742 on the upper surface of the dielectric plate that are electrically interconnected to the respective conductor exposed at the shelf in the triaxial cable and vias 744, 746, 748, 750 extending between the upper and lower surfaces of the dielectric plate.

Figure 15:
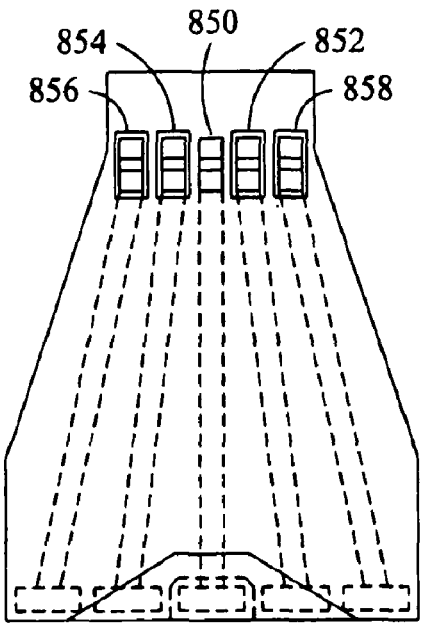
FIG. 15 is a top view and an elevation view of a probe head comprising a dielectric membrane plate.
Figure 15:
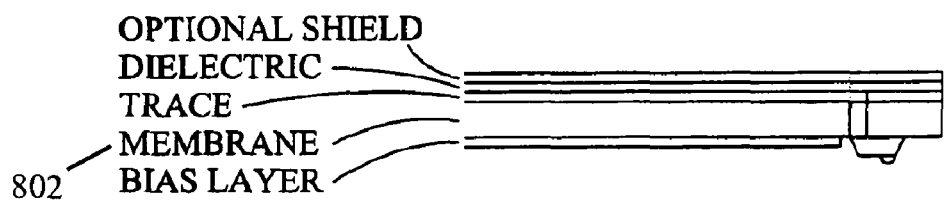

Referring to FIG. 15, in an additional embodiment a flexible dielectric membrane plate 802 may be substituted for a more rigid dielectric plate. An example of membrane material is described in U.S. Pat. No. 5,914,613. In general, membrane based probes are characterized by a flexible (or semi-flexible) plate or substrate with traces supported thereon together with contacting portions or probe tips being supported thereon. The linear array of probe tips 850, 852, 854, 856, 858 are arranged to be co-locatable with the probe pads of the DUT. The traces are normally on the opposing side of the membrane and connected to the probe tips with vias. In many cases, the membrane technology may be significantly thinner than ceramic based substrates or plates, such as 40, 30, 20, 10, 5, or 3 microns or less. Normally the dielectric constant of the membrane material is 7 or less, sometimes less than 6, 5, or 4 depending on the particular material used. While normally using a membrane substrate with a lower dielectric constant is unsuitable, using a significantly thinner substrate together with a material having a lower dielectric constant raises the theoretical frequency range of effective signal transmission to hundreds of GHz. The significantly thinner substrate material permits positioning the lower bias layer significantly closer to the signal traces than the relatively thick ceramic substrate, and therefore tends to more tightly confine the electromagnetic fields.

When a probe tip of a membrane based probe head comes into contact with a probe pad, as in most probes, it tends to skate across the pad as additional pressure is exerted. This skating is the result of the angled probe and/or co-axial cable flexing while under increasing pressure against the probe pad. A limited amount of skating is useful to "scrub" away oxide layers, or otherwise, that may build up on the probe pad. In many cases the probe pad is typically relatively small and excessive skating from the application of slightly too much pressure results in the probe simply skating off the probe pad. In addition, if excessive pressure is exerted damage to the probe and/or probe pad may result. Accordingly, there is an acceptable range of pressure and skating that should be maintained.

A probe measurement system including a probe comprising a linear array of probe tips enables testing of a differential or balanced test structure with a single probe facilitating fabrication of the test structure in a saw street between dies on a wafer.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A probe for testing a differential test structure having a plurality of probe pads, said probe comprising:
   (a) a first probe tip operable to conduct a first mode component of a first differential signal;
   (b) a second probe tip proximate said first probe tip and operable to conduct a first mode component of a second differential signal;
   (c) a third probe tip proximate said second probe tip;
   (d) a fourth probe tip proximate said third probe tip and operable to conduct a second mode component of said second differential signal contemporaneous with conduction of said first mode component of said first differential signal by said first probe tip; and
   (e) a fifth probe tip proximate said fourth probe tip and operable to conduct a second mode component of said first differential signal contemporaneous with conduction of said first mode component of said second differential signal by said second probe tip; said first, said second, said fourth and said fifth probe tips being arranged in a substantially linear array and, with said third probe tip, contemporaneously co-locatable with respective probe pads of said test structure.

2. The probe of claim 1 wherein a source of said first differential signal comprises said respective probe pads of said test structure co-locatable with said first and said fifth probe tips.

3. The probe of claim 1 wherein a source of said second differential signal comprises said respective probe pads of said test structure co-locatable with said second and said fourth probe tips.

4. The probe of claim 1 wherein said third probe tip is interconnected to a source of a direct current.

5. The probe of claim 1 wherein said third probe tip is aligned substantially linearly with said linear array of said first, said second, said fourth and said fifth probe tips.

6. The probe of claim 5 further comprising:
   (a) a sixth probe tip proximate said first probe tip; and
   (b) a seventh probe tip proximate said fifth probe tip; said sixth and said seventh probe tips being arrayed substantially linearly with said first, said second, said third, said fourth and said fifth probe tips; interconnected to said third probe tip and co-locatable with respective probe pads of said test structure.

7. The probe of claim 6 wherein said third probe tip is interconnected to a source of a direct current.

8. A probe for testing a differential test structure having a plurality of probe pads, said probe comprising:
   (a) a dielectric plate having a substantially planar first surface and a second surface;
   (b) a first probe tip projecting from said first surface and operable to conduct a first mode component of a first differential signal;
   (c) a second probe tip projecting from said first surface proximate said first probe tip and operable to conduct a first mode component of a second differential signal;
   (d) a third probe tip projecting from said first surface proximate said second probe tip;
   (e) a fourth probe tip projecting from said first surface proximate said third probe tip and operable to conduct a second mode component of said second differential signal contemporaneous with conduction of said first mode component of said first differential signal by said first probe tip; and
   (f) a fifth probe tip projecting from said first surface proximate said fourth probe tip and operable to conduct a second mode component of said first differential signal contemporaneous with conduction of said first mode component of said second differential signal by said second probe tip; said first, said second, said fourth and said fifth probe tips being arranged in a substantially linear array and contemporaneously co-locatable with respective probe pads of said test structure.

9. The probe of claim 8 wherein a source of said first differential signal comprises said respective probe pads of said test structure co-locatable with said first and said fifth probe tips.

10. The probe of claim 8 wherein a source of said second differential signal comprises said respective probe pads of said test structure co-locatable with said second and said fourth probe tips.

11. The probe of claim 8 wherein said third probe tip is interconnected to a source of a direct current.

12. The probe of claim 8 wherein said third probe tip is aligned substantially linearly with said linear array of said first, said second, said fourth and said fifth probe tips.

13. The probe of claim 12 further comprising:
   (a) a sixth probe tip proximate said first probe tip; and
   (b) a seventh probe tip proximate said fifth probe tip; said sixth and said seventh probe tips being arrayed substantially linearly with said first, said second, said third, said fourth and said fifth probe tips; interconnected to said third probe tip and co-locatable with respective probe pads of said test structure.

14. The probe of claim 8 further comprising:
   (a) a first conductor overlaying an area of said first surface and electrically interconnected with said third probe tip;
   (b) a second conductor extending from said first surface to said second surface of said dielectric plate and electrically interconnected with said first conductor; and
   (c) a conductor of direct current electrically interconnected with said second conductor.

15. The probe of claim 14 further comprising:
   (a) a sixth probe tip projecting from said first surface proximate said first probe tip; and
   (b) a seventh probe tip projecting from said first surface proximate said fifth probe tip, said sixth and said seventh probe tips being electrically interconnected with said first conductor and arrayed substantially linearly with said first, said second, said third, said fourth and said fifth probe tips and respectively co-locatable with probe pads of said test structure.

16. The probe of claim 8 further comprising:
(a) a first conductor overlaying an area of said second surface; and
(b) a second conductor extending from said second surface of said dielectric plate and electrically interconnecting said first conductor with a ground potential.

17. The probe of claim 8 wherein said dielectric plate is rigid.

18. The probe of claim 8 wherein said dielectric plate is flexible.

19. A system for measuring a performance of a differential test structure having a plurality of probe pads, said system comprising:
(a) a source of a modulated differential signal comprising an even mode component and an odd mode component of approximately equal amplitude and opposite phase angle, said differential signal including a direct current component;
(b) a first bias tee interconnected with said source, said first bias tee separating said direct current component from one of said even mode component and said odd mode component of said modulated differential signal;
(c) a second bias tee interconnected with said source, said second bias tee separating said direct current component from the other of said even mode component and said odd mode component of said modulated differential signal;
(d) a probe comprising:
(i) a first probe tip interconnected to communicate one of said even mode component and said odd mode component of said modulated differential signal from one of said first bias tee and said second bias tee to a first probe pad of said test structure;
(ii) a second probe tip co-locatable with a second probe pad of said test structure;
(iii) a third probe tip interconnected with at least one of said first bias tee and said second bias tee to conduct said direct current component to a third probe pad of said test structure;
(iv) a fourth probe tip co-locatable with a fourth probe pad of said test structure;
(v) a fifth probe tip interconnected to communicate the other of said even mode component and said odd mode component of said modulated differential signal from the other of said first bias tee and said second bias tee to a fifth probe pad of said test structure, said first, said second, said third, said fourth and said fifth probe tips arranged to be contemporaneously co-locatable with said respective probe pads of said test structure and at least said first, said second, said fourth and said fifth probe tips being arranged in a substantially linear array; and
(e) a signal sink interconnected with said second probe tip and said fourth probe tip, said sink receiving a signal conducted from said second probe pad and said fourth probe pad of said test structure.

20. The system for measuring a performance of a differential test structure of claim 19 wherein said source of said modulated differential signal comprising an even mode component and an odd mode component of approximately equal amplitude and opposite phase angle comprises:
(a) a source of a single ended signal including a modulated signal component and a direct current component; and
(b) a first balun interconnecting said source and said first and said second bias tees, said first balun converting said single ended signal to a differential signal comprising an even mode component and an odd mode component of approximately equal amplitude and opposite phase angle.

21. The system for measuring a performance of a differential test structure of claim 20 further comprising a second balun interconnecting said second and said fourth probe tips and said sink, said second balun converting a differential signal transmitted from said second probe pad and said fourth probe pad to a single ended signal.

22. The system for measuring a performance of a differential test structure of claim 19 wherein:
(a) said second probe tip is proximate said first probe tip;
(b) said third probe tip is proximate said second probe tip;
(c) said fourth probe tip is proximate said third probe tip; and
(d) said fifth probe tip is proximate said fourth probe tip.

23. The system for measuring a performance of a differential test structure of claim 19 wherein:
(a) said second probe tip is proximate said first probe tip;
(b) said third probe tip is proximate said first probe tip;
(c) said fourth probe tip is proximate said fifth probe tip; and
(d) said fifth probe tip is proximate said third probe tip.

24. A system for measuring a characteristic of a differential gain cell having a first input terminal, a second input terminal, a first output terminal for transmitting a first output signal controllable by a signal at said first input terminal and a second output terminal for transmitting a second output signal controllable by a signal at said second input terminal, said system comprising:
(a) a source of a first differential signal having a first frequency of modulation, said first differential signal comprising a first mode component and a second mode component of approximately equal magnitude and opposite phase angle;
(b) an interconnection of said source and said first input terminal of said differential gain cell enabling communication of said first mode component of said first differential signal to said first input terminal;
(c) an interconnection of said source and said second input terminal of said differential gain cell enabling communication of said second mode component of said first differential signal to said second input terminal;
(d) a source of a second differential signal having a second frequency of modulation, said second differential signal comprising a first mode component and a second mode component of approximately equal magnitude and opposite phase angle;
(e) an interconnection of said first output terminal of said differential gain cell and said second source enabling conducting of a first combined signal comprising a combination of said first mode component of said second differential signal and a first mode component of an output signal of said differential gain cell;
(f) an interconnection of said second output terminal of said differential gain cell and said second source enabling conducting of a second combined signal comprising a combination of said second mode component of said second differential signal and a second mode component of an output signal of said differential gain cell;
(g) a first filter selectively permitting transmission of a portion of said first combined signal having a frequency approximately equal to a difference between said first frequency and said second frequency;

(h) a second filter selectively permitting transmission of a portion of said second combined signal having a frequency approximately equal to a difference between said first frequency and said second frequency; and (i) a signal sink interconnected to said first filter and said second filter, said signal sink enabling analysis of said first and said second combined signals.

25. The system for measuring a characteristic of a differential test structure of claim 24 wherein said source of said first differential signal comprises:

(a) a source of a single ended signal; and (b) a first balun interconnecting said source and said first and said input terminals of said differential gain cell.

26. The system for measuring a characteristic of a differential test structure of claim 24 wherein said source of said second differential signal comprises:

(a) a source of a single ended signal; and (b) a balun interconnecting said source and said first and said output terminals of said differential gain cell.

* * * * *